US006704558B1

United States Patent
Sorrells et al.

(10) Patent No.: US 6,704,558 B1
(45) Date of Patent: Mar. 9, 2004

(54) IMAGE-REJECT DOWN-CONVERTER AND EMBODIMENTS THEREOF, SUCH AS THE FAMILY RADIO SERVICE

(75) Inventors: David F. Sorrells, Jacksonville, FL (US); Michael J. Bultman, Jacksonville, FL (US); Charles D. Clements, Jacksonville, FL (US); Robert W. Cook, Switzerland, FL (US); Joseph M. Hamilla, St. Augustine, FL (US); Richard C. Looke, Jacksonville, FL (US); Charley D. Moses, Jr., Jacksonville, FL (US); Gregory S. Silver, St. Augustine, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

(21) Appl. No.: 09/476,091

(22) Filed: Jan. 3, 2000

Related U.S. Application Data

(60) Provisional application No. 60/116,850, filed on Jan. 22, 1999.

(51) Int. Cl.[7] ............................................... H04B 1/26
(52) U.S. Cl. ..................... 455/323; 455/285; 455/302; 375/349
(58) Field of Search ................ 455/285, 302, 455/304, 232.1, 323; 375/349, 351

(56) References Cited

U.S. PATENT DOCUMENTS

| 2,057,613 A | 10/1936 | Gardner ........................ 250/8 |
| 2,241,078 A | 5/1941 | Vreeland ..................... 179/15 |
| 2,270,385 A | 1/1942 | Skillman ..................... 179/15 |
| 2,283,575 A | 5/1942 | Roberts ........................ 250/6 |
| 2,358,152 A | 9/1944 | Earp ........................ 179/171.5 |
| 2,410,350 A | 10/1946 | Labin et al. ................... 179/15 |

(List continued on next page.)

FOREIGN PATENT DOCUMENTS

| DE | 35 41 031 A1 | 5/1986 | ............ H03D/3/00 |
| DE | 42 37 692 C1 | 3/1994 | ............ H04B/1/26 |
| DE | 197 35 798 C1 | 7/1998 | ............ H04L/27/00 |
| EP | 0 035 166 A1 | 9/1981 | ............ H04B/1/26 |
| EP | 0 099 265 A1 | 1/1984 | ............ H03D/3/04 |

(List continued on next page.)

OTHER PUBLICATIONS

Aghvami, H. et al., "Land Mobile Satellites Using the Highly Elliptic Orbits—The UK T–SAT Mobile Payload," *Fourth International Conference on Satellite Systems for Mobile Communications and Navigation*, IEE, pp. 147–153 (Oct. 17–19, 1988).

Akers, N.P. et al., "RF Sampling Gates: a Brief Review," *IEE Proceedings*, IEE, vol. 133, Part A, No. 1, pp. 45–49 (Jan. 1986).

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizers*, IEE, pp. 4/1–4/5 (Jan. 23, 1986).

(List continued on next page.)

*Primary Examiner*—Lee Nguyen
(74) *Attorney, Agent, or Firm*—Sterne, Kessler, Goldstein & Fox P.L.L.C.

(57) ABSTRACT

A method and system is described for several embodiments of a communication system. In a first embodiment, a method and system is described wherein a signal is received and down-converted and wherein power consumption can be characterized as "ultra-low." In a second embodiment, a method and system is described wherein undesirable images are rejected in a down-conversion system. In a third embodiment, a method and system is described wherein a signal is transmitted in a highly efficient manner. In one implementation the present invention is used in a family radio system.

22 Claims, 15 Drawing Sheets

U.S. PATENT DOCUMENTS

| | | | |
|---|---|---|---|
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |
| 2,499,279 A | 2/1950 | Peterson | 332/41 |
| 2,802,208 A | 8/1957 | Hobbs | 343/176 |
| 2,985,875 A | 5/1961 | Grisdale et al. | 343/100 |
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A | 4/1966 | Kryter | |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,617,892 A | 11/1971 | Hawley et al. | 325/145 |
| 3,621,402 A | 11/1971 | Gardner | 328/37 |
| 3,622,885 A | 11/1971 | Oberdorf et al. | |
| 3,623,160 A | 11/1971 | Giles et al. | 340/347 DA |
| 3,626,417 A | 12/1971 | Gilbert | 343/203 |
| 3,629,696 A | 12/1971 | Bartelink | 324/57 R |
| 3,662,268 A | 5/1972 | Gans et al. | 325/56 |
| 3,689,841 A | 9/1972 | Bello et al. | 325/39 |
| 3,702,440 A | 11/1972 | Moore | |
| 3,714,577 A | 1/1973 | Hayes | 325/145 |
| 3,716,730 A | 2/1973 | Cerny, Jr. | 307/295 |
| 3,717,844 A | 2/1973 | Barret et al. | 340/5 R |
| 3,735,048 A | 5/1973 | Tomsa et al. | 179/15 BM |
| 3,767,984 A | 10/1973 | Shinoda et al. | |
| 3,806,811 A | 4/1974 | Thompson | 325/146 |
| 3,852,530 A | 12/1974 | Shen | |
| 3,868,601 A | 2/1975 | MacAfee | 332/45 |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,013,966 A | 3/1977 | Campbell | 325/363 |
| 4,017,798 A | 4/1977 | Gordy et al. | 325/42 |
| 4,019,140 A | 4/1977 | Swerdlow | 322/65 |
| 4,032,847 A | 6/1977 | Unkauf | 325/323 |
| 4,035,732 A | 7/1977 | Lohrmann | 325/446 |
| 4,047,121 A | 9/1977 | Campbell | 331/76 |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | 325/439 |
| 4,081,748 A | 3/1978 | Batz | 325/56 |
| 4,130,765 A | 12/1978 | Arakelian et al. | 307/220 R |
| 4,130,806 A | 12/1978 | Van Gerwen et al. | 325/487 |
| 4,142,155 A | 2/1979 | Adachi | 325/47 |
| 4,170,764 A | 10/1979 | Salz et al. | 332/17 |
| 4,204,171 A | 5/1980 | Sutphin, Jr. | 328/167 |
| 4,210,872 A | 7/1980 | Gregorian | 330/9 |
| 4,220,977 A | 9/1980 | Yamanaka | |
| 4,245,355 A | 1/1981 | Pascoe et al. | 455/326 |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,308,614 A | 12/1981 | Fisher et al. | 370/119 |
| 4,320,361 A | 3/1982 | Kikkert | 332/16 R |
| 4,320,536 A | 3/1982 | Dietrich | 455/325 |
| 4,334,324 A | 6/1982 | Hoover | 455/333 |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,365,217 A | 12/1982 | Berger et al. | 333/165 |
| 4,369,522 A | 1/1983 | Cerny, Jr. et al. | 455/333 |
| 4,370,572 A | 1/1983 | Cosand et al. | 307/353 |
| 4,384,357 A | 5/1983 | deBuda et al. | |
| 4,389,579 A | 6/1983 | Stein | 307/353 |
| 4,392,255 A | 7/1983 | Del Giudice | 455/328 |
| 4,393,395 A | 7/1983 | Hacke et al. | 358/23 |
| 4,430,629 A | 2/1984 | Betzl et al. | 333/165 |
| 4,446,438 A | 5/1984 | Chang et al. | 328/127 |
| 4,456,990 A | 6/1984 | Fisher et al. | 370/119 |
| 4,470,145 A | 9/1984 | Williams | |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | |
| 4,484,143 A | 11/1984 | French et al. | 329/50 |
| 4,485,488 A | 11/1984 | Houdart | 455/327 |
| 4,504,803 A | 3/1985 | Lee et al. | 332/31 R |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,563,773 A | 1/1986 | Dixon, Jr. et al. | 455/327 |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,653,117 A | 3/1987 | Heck | 455/209 |
| 4,660,164 A | 4/1987 | Leibowitz | |
| 4,675,882 A | 6/1987 | Lillie et al. | 375/80 |
| 4,688,253 A | 8/1987 | Gumm | 381/7 |
| 4,716,376 A | 12/1987 | Daudelin | 329/107 |
| 4,716,388 A | 12/1987 | Jacobs | 333/173 |
| 4,718,113 A | 1/1988 | Rother et al. | 455/209 |
| 4,726,041 A | 2/1988 | Prohaska et al. | 375/91 |
| 4,733,403 A | 3/1988 | Simone | 375/103 |
| 4,734,591 A | 3/1988 | Ichitsubo | 307/219.1 |
| 4,737,969 A | 4/1988 | Steel et al. | 375/67 |
| 4,743,858 A | 5/1988 | Everard | 330/10 |
| 4,745,463 A | 5/1988 | Lu | 358/23 |
| 4,751,468 A | 6/1988 | Agoston | 328/133 |
| 4,757,538 A | 7/1988 | Zink | 381/7 |
| 4,768,187 A | 8/1988 | Marshall | 370/69.1 |
| 4,769,612 A | 9/1988 | Tamakoshi et al. | 328/167 |
| 4,785,463 A | 11/1988 | Janc et al. | 375/1 |
| 4,791,584 A | 12/1988 | Greivenkamp, Jr. | 364/525 |
| 4,801,823 A | 1/1989 | Yokoyama | 307/353 |
| 4,806,790 A | 2/1989 | Sone | 307/353 |
| 4,810,904 A | 3/1989 | Crawford | 307/353 |
| 4,810,976 A | 3/1989 | Cowley et al. | 331/117 R |
| 4,811,362 A | 3/1989 | Yester, Jr. et al. | 375/75 |
| 4,816,704 A | 3/1989 | Fiori, Jr. | 307/519 |
| 4,819,252 A | 4/1989 | Christopher | 375/122 |
| 4,833,445 A | 5/1989 | Buchele | 341/118 |
| 4,841,265 A | 6/1989 | Watanabe et al. | 333/194 |

| Patent | Date | Inventor | Class |
|---|---|---|---|
| 4,855,894 A | 8/1989 | Asahi et al. | 363/157 |
| 4,857,928 A | 8/1989 | Gailus et al. | |
| 4,862,121 A | 8/1989 | Hochschild et al. | 333/173 |
| 4,868,654 A | 9/1989 | Juri et al. | 358/133 |
| 4,870,659 A | 9/1989 | Oishi et al. | 375/82 |
| 4,871,987 A | 10/1989 | Kawase | 332/100 |
| 4,885,587 A | 12/1989 | Wiegand et al. | 42/14 |
| 4,885,756 A | 12/1989 | Fontanes et al. | 375/82 |
| 4,888,557 A | 12/1989 | Puckette, IV et al. | 329/341 |
| 4,890,302 A | 12/1989 | Muilwijk | 375/80 |
| 4,893,316 A | 1/1990 | Janc et al. | 375/44 |
| 4,893,341 A | 1/1990 | Gehring | 381/7 |
| 4,894,766 A | 1/1990 | De Agro | 363/159 |
| 4,896,152 A | 1/1990 | Tiemann | 340/853 |
| 4,902,979 A | 2/1990 | Puckette, IV | 329/343 |
| 4,908,579 A | 3/1990 | Tawfik et al. | 328/167 |
| 4,910,752 A | 3/1990 | Yester, Jr. et al. | 375/75 |
| 4,914,405 A | 4/1990 | Wells | 331/25 |
| 4,920,510 A | 4/1990 | Senderowicz et al. | 364/825 |
| 4,922,452 A | 5/1990 | Larsen et al. | 365/45 |
| 4,931,921 A | 6/1990 | Anderson | 363/163 |
| 4,943,974 A | 7/1990 | Motamedi | 375/1 |
| 4,944,025 A | 7/1990 | Gehring et al. | 455/207 |
| 4,955,079 A | 9/1990 | Connerney et al. | 455/325 |
| 4,965,467 A | 10/1990 | Bilterijst | 307/352 |
| 4,967,160 A | 10/1990 | Quievy et al. | 328/16 |
| 4,970,703 A | 11/1990 | Hariharan et al. | 367/138 |
| 4,982,353 A | 1/1991 | Jacob et al. | 364/724.1 |
| 4,984,077 A | 1/1991 | Uchida | 358/140 |
| 4,995,055 A | 2/1991 | Weinberger et al. | 375/5 |
| 5,003,621 A | 3/1991 | Gailus | 455/209 |
| 5,005,169 A | 4/1991 | Bronder et al. | 370/76 |
| 5,006,810 A | 4/1991 | Popescu | 328/167 |
| 5,010,585 A | 4/1991 | Garcia | 455/118 |
| 5,014,304 A | 5/1991 | Nicollini et al. | 379/399 |
| 5,015,963 A | 5/1991 | Sutton | 329/361 |
| 5,016,242 A | 5/1991 | Tang | |
| 5,017,924 A | 5/1991 | Guiberteau et al. | 342/195 |
| 5,020,149 A | 5/1991 | Hemmie | 455/325 |
| 5,020,154 A | 5/1991 | Zierhut | 455/608 |
| 5,052,050 A | 9/1991 | Collier et al. | 455/296 |
| 5,065,409 A | 11/1991 | Hughes et al. | 375/91 |
| 5,083,050 A | 1/1992 | Vasile | 307/529 |
| 5,091,921 A | 2/1992 | Minami | 375/88 |
| 5,095,533 A | 3/1992 | Loper et al. | 455/245 |
| 5,095,536 A | 3/1992 | Loper | 455/324 |
| 5,111,152 A | 5/1992 | Makino | 329/300 |
| 5,113,094 A | 5/1992 | Grace et al. | 307/529 |
| 5,113,129 A | 5/1992 | Hughes | 323/316 |
| 5,115,409 A | 5/1992 | Stepp | 364/841 |
| 5,122,765 A | 6/1992 | Pataut | 332/105 |
| 5,124,592 A | 6/1992 | Hagino | 307/520 |
| 5,126,682 A | 6/1992 | Weinberg et al. | 329/304 |
| 5,136,267 A | 8/1992 | Cabot | 333/174 |
| 5,140,705 A | 8/1992 | Kosuga | 455/318 |
| 5,150,124 A | 9/1992 | Moore et al. | 342/68 |
| 5,151,661 A | 9/1992 | Caldwell et al. | 328/14 |
| 5,157,687 A | 10/1992 | Tymes | |
| 5,159,710 A | 10/1992 | Cusdin | 455/304 |
| 5,170,414 A | 12/1992 | Silvian | 375/59 |
| 5,172,070 A | 12/1992 | Hiraiwa et al. | 329/304 |
| 5,191,459 A | 3/1993 | Thompson et al. | 359/133 |
| 5,204,642 A | 4/1993 | Ashgar et al. | 331/135 |
| 5,212,827 A | 5/1993 | Meszko et al. | 455/219 |
| 5,214,787 A | 5/1993 | Karkota, Jr. | 455/3.2 |
| 5,220,583 A | 6/1993 | Solomon | 375/82 |
| 5,220,680 A | 6/1993 | Lee | 455/102 |
| 5,222,144 A | 6/1993 | Whikehart | 381/15 |
| 5,230,097 A | 7/1993 | Currie et al. | 455/226.1 |
| 5,239,686 A | 8/1993 | Downey | 455/78 |
| 5,241,561 A | 8/1993 | Barnard | 375/1 |
| 5,249,203 A | 9/1993 | Loper | 375/97 |
| 5,251,218 A | 10/1993 | Stone et al. | 370/120 |
| 5,251,232 A | 10/1993 | Nonami | 375/5 |
| 5,260,970 A | 11/1993 | Henry et al. | 375/10 |
| 5,263,194 A | 11/1993 | Ragan | 455/316 |
| 5,263,196 A | 11/1993 | Jasper | 455/324 |
| 5,267,023 A | 11/1993 | Kawasaki | 358/23 |
| 5,278,826 A | 1/1994 | Murphy et al. | 370/76 |
| 5,282,023 A | 1/1994 | Scarpa | 358/36 |
| 5,287,516 A | 2/1994 | Schaub | 375/88 |
| 5,293,398 A | 3/1994 | Hamao et al. | 375/1 |
| 5,303,417 A | 4/1994 | Laws | 455/314 |
| 5,307,517 A | 4/1994 | Rich | 455/306 |
| 5,315,583 A | 5/1994 | Murphy et al. | 370/18 |
| 5,319,799 A | 6/1994 | Morita | 455/78 |
| 5,321,852 A | 6/1994 | Seong | 455/182.1 |
| 5,325,204 A | 6/1994 | Scarpa | 348/607 |
| 5,337,014 A | 8/1994 | Najle et al. | 324/613 |
| 5,339,054 A | 8/1994 | Taguchi | 332/100 |
| 5,339,459 A | 8/1994 | Schiltz et al. | 455/333 |
| 5,353,306 A | 10/1994 | Yamamoto | 375/14 |
| 5,355,114 A | 10/1994 | Sutterlin et al. | 340/310 A |
| 5,361,408 A | 11/1994 | Watanabe et al. | 455/324 |
| 5,369,404 A | 11/1994 | Galton | 341/143 |
| 5,369,800 A | 11/1994 | Takagi et al. | 455/59 |
| 5,375,146 A | 12/1994 | Chalmers | 375/103 |
| 5,379,040 A | 1/1995 | Mizomoto et al. | 341/143 |
| 5,379,141 A | 1/1995 | Thompson et al. | 359/125 |
| 5,388,063 A | 2/1995 | Takatori et al. | 364/724.17 |
| 5,389,839 A | 2/1995 | Heck | |
| 5,390,364 A | 2/1995 | Webster et al. | 455/52.3 |
| 5,400,084 A | 3/1995 | Scarpa | 348/624 |
| 5,404,127 A | 4/1995 | Lee et al. | 340/310.02 |
| 5,410,326 A | 4/1995 | Goldstein | |
| 5,410,541 A | 4/1995 | Hotto | 370/76 |
| 5,410,743 A | 4/1995 | Seely et al. | 455/326 |
| 5,412,352 A | 5/1995 | Graham | 332/103 |
| 5,416,803 A | 5/1995 | Janer | 375/324 |
| 5,422,913 A | 6/1995 | Wilkinson | 375/347 |
| 5,423,082 A | 6/1995 | Cygan et al. | 455/126 |
| 5,428,638 A | 6/1995 | Cioffi et al. | 375/224 |
| 5,428,640 A | 6/1995 | Townley | 375/257 |
| 5,434,546 A | 7/1995 | Palmer | 332/151 |
| 5,438,692 A | 8/1995 | Mohindra | 455/324 |
| 5,444,415 A | 8/1995 | Dent et al. | 329/302 |
| 5,444,416 A | 8/1995 | Ishikawa et al. | 329/341 |
| 5,444,865 A | 8/1995 | Heck et al. | 455/86 |
| 5,446,421 A | 8/1995 | Kechkaylo | 332/100 |
| 5,446,422 A | 8/1995 | Mattila et al. | 332/103 |
| 5,448,602 A | 9/1995 | Ohmori et al. | 375/347 |
| 5,451,899 A | 9/1995 | Lawton | 329/302 |
| 5,454,007 A | 9/1995 | Dutta | 375/322 |
| 5,454,009 A | 9/1995 | Fruit et al. | 372/202 |
| 5,463,356 A | 10/1995 | Palmer | 332/117 |
| 5,463,357 A | 10/1995 | Hobden | 332/151 |
| 5,465,071 A | 11/1995 | Kobayashi et al. | 329/315 |
| 5,465,410 A | 11/1995 | Hiben et al. | 455/266 |
| 5,465,415 A | 11/1995 | Bien | 455/326 |
| 5,465,418 A | 11/1995 | Zhou et al. | 455/332 |
| 5,471,162 A | 11/1995 | McEwan | 327/92 |
| 5,471,665 A | 11/1995 | Pace et al. | |
| 5,479,120 A | 12/1995 | McEwan | 327/91 |
| 5,479,447 A | 12/1995 | Chow et al. | 375/260 |
| 5,483,193 A | 1/1996 | Kennedy et al. | 329/300 |
| 5,483,549 A | 1/1996 | Weinberg et al. | 375/200 |
| 5,483,691 A | 1/1996 | Heck et al. | 455/234.2 |
| 5,483,695 A | 1/1996 | Pardoen | |
| 5,490,173 A | 2/1996 | Whikehart et al. | 375/316 |
| 5,493,581 A | 2/1996 | Young et al. | 375/350 |
| 5,493,721 A | 2/1996 | Reis | 455/339 |
| 5,495,200 A | 2/1996 | Kwan et al. | 327/554 |

| | | | |
|---|---|---|---|
| 5,495,202 A | 2/1996 | Hsu ............................ 327/113 |
| 5,495,500 A | 2/1996 | Jovanovich et al. ......... 375/206 |
| 5,499,267 A | 3/1996 | Ohe et al. .................... 375/206 |
| 5,500,758 A | 3/1996 | Thompson et al. .......... 359/189 |
| 5,513,389 A | 4/1996 | Reeser et al. ................ 455/311 |
| 5,515,014 A | 5/1996 | Troutman .................... 332/178 |
| 5,517,688 A | 5/1996 | Fajen et al. .................. 455/333 |
| 5,519,890 A | 5/1996 | Pinckley ...................... 455/307 |
| 5,523,719 A | 6/1996 | Longo et al. ................. 327/557 |
| 5,523,726 A | 6/1996 | Kroeger et al. .............. 332/103 |
| 5,523,760 A | 6/1996 | McEwan ....................... 342/89 |
| 5,539,770 A | 7/1996 | Ishigaki ....................... 375/206 |
| 5,555,453 A | 9/1996 | Kajimoto et al. ............ 455/266 |
| 5,557,641 A | 9/1996 | Weinberg ..................... 375/295 |
| 5,557,642 A | 9/1996 | Williams ..................... 375/316 |
| 5,563,550 A | 10/1996 | Toth ............................. 329/347 |
| 5,564,097 A | 10/1996 | Swanke |
| 5,574,755 A | 11/1996 | Persico ........................ 375/295 |
| 5,579,341 A | 11/1996 | Smith et al. ................. 375/267 |
| 5,579,347 A | 11/1996 | Lindquist et al. ............ 375/346 |
| 5,584,068 A | 12/1996 | Mohindra .................... 455/324 |
| 5,592,131 A | 1/1997 | Labreche et al. ............ 332/103 |
| 5,600,680 A | 2/1997 | Mishima et al. |
| 5,602,847 A | 2/1997 | Pagano et al. ............... 370/484 |
| 5,602,868 A | 2/1997 | Wilson ........................ 375/219 |
| 5,604,592 A | 2/1997 | Kotidis et al. ............... 356/357 |
| 5,604,732 A | 2/1997 | Kim et al. .................... 370/342 |
| 5,606,731 A | 2/1997 | Pace et al. |
| 5,608,531 A | 3/1997 | Honda et al. .................. 386/1 |
| 5,610,946 A | 3/1997 | Tanaka et al. ................ 375/269 |
| RE35,494 E | 4/1997 | Nicollini ...................... 327/554 |
| 5,617,451 A | 4/1997 | Mimura et al. .............. 375/340 |
| 5,619,538 A | 4/1997 | Sempel et al. ............... 375/328 |
| 5,621,455 A | 4/1997 | Rogers et al. .................. 348/6 |
| 5,628,055 A | 5/1997 | Stein |
| 5,630,227 A | 5/1997 | Bella et al. .................. 455/324 |
| 5,633,815 A | 5/1997 | Young |
| 5,638,396 A | 6/1997 | Klimek ......................... 372/92 |
| 5,640,415 A | 6/1997 | Pandula ........................ 375/202 |
| 5,640,424 A | 6/1997 | Banavong et al. ........... 375/316 |
| 5,640,428 A | 6/1997 | Abe et al. .................... 375/334 |
| 5,640,698 A | 6/1997 | Shen et al. ................... 455/323 |
| 5,648,985 A | 7/1997 | Bjerede et al. ............... 375/219 |
| 5,650,785 A | 7/1997 | Rodal ........................... 342/357 |
| 5,661,424 A | 8/1997 | Tang ............................ 327/105 |
| 5,663,878 A | 9/1997 | Walker ......................... 363/159 |
| 5,663,986 A | 9/1997 | Striffler ........................ 375/260 |
| 5,668,836 A | 9/1997 | Smith et al. ................. 375/316 |
| 5,675,392 A | 10/1997 | Nayebi et al. ............... 348/584 |
| 5,678,220 A * | 10/1997 | Fournier ...................... 455/302 |
| 5,680,078 A | 10/1997 | Ariie ............................ 332/178 |
| 5,680,418 A | 10/1997 | Croft et al. ................... 375/346 |
| 5,689,413 A | 11/1997 | Jaramillo et al. ............ 363/146 |
| 5,694,096 A | 12/1997 | Ushiroku et al. ............ 333/195 |
| 5,699,006 A | 12/1997 | Zele et al. .................... 327/341 |
| 5,705,949 A | 1/1998 | Alelyunas et al. ........... 329/304 |
| 5,705,955 A | 1/1998 | Freeburg et al. ............. 331/14 |
| 5,710,998 A | 1/1998 | Opas ............................ 455/324 |
| 5,714,910 A | 2/1998 | Skoczen et al. ................ 331/3 |
| 5,715,281 A | 2/1998 | Bly et al. ..................... 375/344 |
| 5,721,514 A | 2/1998 | Crockett et al. ................ 331/3 |
| 5,724,002 A | 3/1998 | Hulick ......................... 329/361 |
| 5,724,653 A | 3/1998 | Baker et al. ................. 455/296 |
| 5,729,577 A | 3/1998 | Chen ............................ 375/334 |
| 5,729,829 A | 3/1998 | Talwar et al. ................. 455/63 |
| 5,732,333 A | 3/1998 | Cox et al. .................... 455/126 |
| 5,736,895 A | 4/1998 | Yu et al. ....................... 327/554 |
| 5,737,035 A | 4/1998 | Rotzoll ........................ 348/725 |
| 5,742,189 A | 4/1998 | Yoshida et al. .............. 327/113 |
| 5,748,683 A | 5/1998 | Smith et al. ................. 375/347 |
| 5,757,870 A | 5/1998 | Miya et al. ................... 375/367 |
| RE35,829 E | 6/1998 | Sanderford, Jr. ............. 375/200 |
| 5,760,645 A | 6/1998 | Comte et al. ................ 329/304 |
| 5,764,087 A | 6/1998 | Clark ........................... 327/105 |
| 5,767,726 A | 6/1998 | Wang .......................... 327/356 |
| 5,768,118 A | 6/1998 | Faulk et al. .................... 363/72 |
| 5,768,323 A | 6/1998 | Kroeger et al. .............. 375/355 |
| 5,770,985 A | 6/1998 | Ushiroku et al. ............ 333/193 |
| 5,771,442 A | 6/1998 | Wang et al. ................... 455/93 |
| 5,777,692 A | 7/1998 | Ghosh ......................... 348/725 |
| 5,777,771 A | 7/1998 | Smith ......................... 359/180 |
| 5,778,022 A | 7/1998 | Walley ......................... 375/206 |
| 5,786,844 A | 7/1998 | Rogers et al. .................. 348/6 |
| 5,793,801 A | 8/1998 | Fertner ......................... 375/219 |
| 5,793,818 A | 8/1998 | Claydon et al. ............. 375/326 |
| 5,801,654 A | 9/1998 | Traylor ........................ 341/144 |
| 5,802,463 A | 9/1998 | Zuckerman .................. 455/208 |
| 5,809,060 A | 9/1998 | Cafarella et al. ............. 375/206 |
| 5,812,546 A | 9/1998 | Zhou et al. ................... 370/342 |
| 5,818,582 A | 10/1998 | Fernandez et al. ........... 356/318 |
| 5,818,869 A | 10/1998 | Miya et al. ................... 375/206 |
| 5,825,254 A | 10/1998 | Lee ................................ 331/25 |
| 5,834,985 A | 11/1998 | Sundegård .................. 332/100 |
| 5,841,324 A | 11/1998 | Williams ...................... 331/17 |
| 5,841,811 A | 11/1998 | Song ............................ 375/235 |
| 5,844,449 A | 12/1998 | Abeno et al. ................ 332/105 |
| 5,859,878 A | 1/1999 | Phillips et al. ............... 375/316 |
| 5,864,754 A | 1/1999 | Hotto .......................... 455/280 |
| 5,870,670 A | 2/1999 | Ripley et al. |
| 5,872,446 A | 2/1999 | Cranford, Jr. et al. ....... 323/315 |
| 5,881,375 A | 3/1999 | Bonds ......................... 455/118 |
| 5,883,548 A | 3/1999 | Assard et al. ................ 329/306 |
| 5,892,380 A | 4/1999 | Quist .......................... 327/172 |
| 5,894,239 A | 4/1999 | Bonaccio et al. ............ 327/176 |
| 5,894,496 A | 4/1999 | Jones .......................... 455/126 |
| 5,896,562 A | 4/1999 | Heinonen ...................... 455/76 |
| 5,898,912 A | 4/1999 | Heck et al. |
| 5,900,747 A | 5/1999 | Brauns ........................... 327/9 |
| 5,901,054 A | 5/1999 | Leu et al. ...................... 363/41 |
| 5,901,187 A | 5/1999 | Iinuma ........................ 375/347 |
| 5,901,344 A | 5/1999 | Opas ............................ 455/76 |
| 5,901,347 A | 5/1999 | Chambers et al. ........ 455/234.1 |
| 5,901,348 A | 5/1999 | Bang et al. .................. 455/254 |
| 5,901,349 A * | 5/1999 | Guegnaud et al. ........... 455/302 |
| 5,903,178 A | 5/1999 | Miyatsuji et al. ............ 327/308 |
| 5,903,187 A | 5/1999 | Claverie et al. ............. 329/342 |
| 5,903,196 A | 5/1999 | Salvi et al. ................... 331/16 |
| 5,903,421 A | 5/1999 | Furutani et al. .............. 361/58 |
| 5,903,553 A | 5/1999 | Sakamoto et al. ........... 370/338 |
| 5,903,595 A | 5/1999 | Suzuki ......................... 375/207 |
| 5,903,609 A | 5/1999 | Kool et al. ................... 375/261 |
| 5,903,827 A | 5/1999 | Kennan et al. ............... 455/326 |
| 5,903,854 A | 5/1999 | Abe et al. ..................... 455/575 |
| 5,905,449 A | 5/1999 | Tsubouchi et al. ....... 340/925.69 |
| 5,907,149 A | 5/1999 | Marckini ..................... 235/487 |
| 5,907,197 A | 5/1999 | Faulk .......................... 307/119 |
| 5,909,447 A | 6/1999 | Cox et al. .................... 370/508 |
| 5,911,116 A | 6/1999 | Nosswitz ...................... 455/83 |
| 5,911,123 A | 6/1999 | Shaffer et al. ............... 455/554 |
| 5,914,622 A | 6/1999 | Inoue .......................... 327/172 |
| 5,915,278 A | 6/1999 | Mallick ........................ 73/658 |
| 5,920,199 A | 7/1999 | Sauer .......................... 324/678 |
| 5,926,065 A | 7/1999 | Wakai et al. |
| 5,933,467 A | 8/1999 | Sehier et al. ................ 375/350 |
| 5,937,013 A | 8/1999 | Lam et al. |
| 5,943,370 A | 8/1999 | Smith ......................... 375/334 |
| 5,945,660 A | 8/1999 | Nakasuji et al. |
| 5,952,895 A | 9/1999 | McCune, Jr. et al. ........ 332/128 |
| 5,953,642 A | 9/1999 | Feldtkeller et al. ....... 455/195.1 |
| 5,956,025 A | 9/1999 | Goulden et al. |
| 5,959,850 A | 9/1999 | Lim ............................ 363/17 |
| 5,960,033 A | 9/1999 | Shibano et al. .............. 375/207 |

| | | | | | | | | |
|---|---|---|---|---|---|---|---|---|
| 6,014,551 | A | 1/2000 | Pesola et al. | | EP | 0 512 748 B1 | 11/1998 | ............ H04N/9/64 |
| 6,028,887 | A | 2/2000 | Harrison et al. ............ 375/206 | | EP | 0 877 476 A1 | 11/1998 | |
| 6,041,073 | A | 3/2000 | Davidovici et al. ......... 375/148 | | EP | 0 977 351 A1 | 2/2000 | |
| 6,049,706 | A | 4/2000 | Cook et al. | | FR | 2 245 130 | 4/1975 | ............ H03K/5/13 |
| 6,054,889 | A | 4/2000 | Kobayashi ................. 327/357 | | FR | 2 743 231 A1 | 7/1997 | ............ H04B/7/12 |
| 6,061,551 | A | 5/2000 | Sorrells et al. | | GB | 2 161 344 A | 1/1986 | ............ H04B/7/12 |
| 6,061,555 | A | 5/2000 | Bultman et al. | | GB | 2 215 945 A | 9/1989 | ............ H04L/27/00 |
| 6,073,001 | A | 6/2000 | Sokoler | | GB | 2 324 919 A | 11/1998 | ............ H03D/7/18 |
| 6,081,691 | A | 6/2000 | Renard et al. .............. 455/12.1 | | JP | 47-2314 | 2/1972 | |
| 6,084,922 | A | 7/2000 | Zhou et al. .................. 375/316 | | JP | 55-66057 | 5/1980 | ............ G06K/7/10 |
| 6,085,073 | A | 7/2000 | Palermo et al. | | JP | 56-114451 | 9/1981 | ............ H04B/7/02 |
| 6,091,939 | A | 7/2000 | Banh | | JP | 58-7903 | 1/1983 | ............ H03C/1/02 |
| 6,091,940 | A | 7/2000 | Sorrells et al. | | JP | 58-133004 | 8/1983 | ............ H03D/1/00 |
| 6,091,941 | A | 7/2000 | Moriyama et al. | | JP | 59-144249 | 8/1984 | ............ H04L/27/00 |
| 6,098,886 | A | 8/2000 | Swift et al. | | JP | 60-58705 | 4/1985 | ............ H03D/7/00 |
| 6,121,819 | A | 9/2000 | Traylor ....................... 327/359 | | JP | 63-54002 | 3/1988 | ......... H03B/19/114 |
| 6,125,271 | A | 9/2000 | Rowland et al. ............ 455/313 | | JP | 63-65587 | 3/1988 | ............ G06K/7/10 |
| 6,127,941 | A | 10/2000 | Van Ryzin | | JP | 63-153691 | 6/1988 | .......... G06K/17/00 |
| 6,144,236 | A | 11/2000 | Vice et al. ................... 327/113 | | JP | 2-39632 | 2/1990 | ............ H04B/7/12 |
| 6,144,846 | A | 11/2000 | Durec ......................... 455/323 | | JP | 2-131629 | 5/1990 | ............ H04B/7/12 |
| 6,147,340 | A | 11/2000 | Levy ...................... 250/214 R | | JP | 2-276351 | 11/1990 | ............ H04L/27/22 |
| 6,147,763 | A | 11/2000 | Steinlechner ................ 356/484 | | JP | 4-123614 | 4/1992 | ....... H03K/19/0175 |
| 6,150,890 | A | 11/2000 | Damgaard et al. ............ 331/14 | | JP | 4-127601 | 4/1992 | ............ H03D/7/00 |
| 6,175,728 | B1 | 1/2001 | Mitama ...................... 455/323 | | JP | 5-175730 | 7/1993 | ............ H03D/1/00 |
| 6,215,475 | B1 | 4/2001 | Meyerson et al. | | JP | 5-175734 | 7/1993 | ............ H03D/3/00 |
| 6,230,000 | B1 | 5/2001 | Tayloe | | JP | 5-327356 | 12/1993 | ............ H03D/7/00 |
| 6,266,518 | B1 | 7/2001 | Sorrells et al. | | JP | 6-237276 | 8/1994 | ............ H04L/27/20 |
| 6,314,279 | B1 | 11/2001 | Mohindra | | JP | 7-154344 | 6/1995 | ............ H04B/14/06 |
| 6,327,313 | B1 | 12/2001 | Traylor et al. | | JP | 7-307620 | 11/1995 | ............ H03D/1/18 |
| 6,330,244 | B1 | 12/2001 | Swartz et al. | | JP | 8-23359 | 1/1996 | ............ H04L/27/20 |
| 6,353,735 | B1 | 3/2002 | Sorrells et al. | | JP | 8-32556 | 2/1996 | ............ H04L/1/04 |
| 6,370,371 | B1 | 4/2002 | Sorrells et al. | | JP | 8-139524 | 5/1996 | ............ H03D/7/00 |
| 6,400,963 | B1 | 6/2002 | Glöckler et al. | | WO | WO 80/01633 A1 | 8/1980 | ............ H04J/1/08 |
| 6,421,534 | B1 | 7/2002 | Cook et al. | | WO | WO 91/18445 A1 | 11/1991 | ............ H03D/7/18 |
| 6,542,722 | B1 | 4/2003 | Sorrells et al. | | WO | WO 94/05087 A1 | 3/1994 | ............ H03M/1/00 |
| 6,560,301 | B1 | 5/2003 | Cook et al. | | WO | WO 95/01006 A1 | 1/1995 | ............ H03M/1/66 |
| 6,580,902 | B1 | 6/2003 | Sorrells et al. | | WO | WO 96/02977 A1 | 2/1996 | ............ H04B/1/26 |
| | | | | | WO | WO 96/08078 A1 | 3/1996 | ............ H03D/3/00 |
| | | FOREIGN PATENT DOCUMENTS | | | WO | WO 96/39750 A1 | 12/1996 | ............ H04B/1/26 |
| | | | | | WO | WO 97/08839 A2 A3 | 3/1997 | ............ H04B/1/04 |
| EP | | 0 254 844 A2 | 2/1988 | ............ H03D/7/00 | WO | WO 97/38490 A1 | 10/1997 | ............ H03K/7/00 |
| EP | | 0 276 130 A2 A3 | 7/1988 | ............ H03D/7/00 | WO | WO 98/00953 A1 | 1/1998 | ............ H04L/27/26 |
| EP | | 0 193 899 B1 | 6/1990 | ............ G01S/7/52 | WO | WO 98/24201 A1 | 6/1998 | ............ H04H/1/00 |
| EP | | 0 380 351 A2 | 8/1990 | .......... H03H/17/04 | WO | WO 98/40968 A2 A3 | 9/1998 | ............ H03L/7/08 |
| EP | | 0 380 351 A3 | 2/1991 | .......... H03H/17/04 | WO | WO 99/23755 A1 | 5/1999 | ............ H03D/7/16 |
| EP | | 0 411 840 A2 | 2/1991 | .......... G01R/33/36 | | | | |
| EP | | 0 423 718 A2 | 4/1991 | ............ H04N/7/01 | | | OTHER PUBLICATIONS | |
| EP | | 0 411 840 A3 | 7/1991 | .......... G01R/33/36 | | | | |
| EP | | 0 486 095 A1 | 5/1992 | ............ H03D/3/00 | | | | |
| EP | | 0 423 718 A3 | 8/1992 | ............ H04N/7/01 | | | | |
| EP | | 0 512 748 A2 | 11/1992 | ............ H04N/9/64 | | | | |
| EP | | 0 529 836 A1 | 3/1993 | ............ H03L/7/089 | | | | |
| EP | | 0 548 542 A1 | 6/1993 | ............ H03B/19/14 | | | | |
| EP | | 0 512 748 A3 | 7/1993 | ............ H04N/9/64 | | | | |
| EP | | 0 560 228 A1 | 9/1993 | ............ H03D/7/12 | | | | |
| EP | | 0 632 288 A2 | 1/1995 | ............ G01S/13/75 | | | | |
| EP | | 0 632 577 A1 | 1/1995 | ............ H03D/7/16 | | | | |
| EP | | 0 643 477 A2 A3 | 3/1995 | | | | | |
| EP | | 0 411 840 B1 | 10/1995 | .......... G01R/33/36 | | | | |
| EP | | 0 696 854 A1 | 2/1996 | ............ H04B/1/26 | | | | |
| EP | | 0 632 288 A3 | 7/1996 | ............ G01S/13/75 | | | | |
| EP | | 0 732 803 A1 | 9/1996 | ............ H03D/3/00 | | | | |
| EP | | 0 486 095 B1 | 2/1997 | ............ H03D/3/00 | | | | |
| EP | | 0 782 275 A2 | 7/1997 | ............ H04B/7/02 | | | | |
| EP | | 0 785 635 A1 | 7/1997 | ............ H04B/1/713 | | | | |
| EP | | 0 789 449 A2 | 8/1997 | ............ H03D/7/12 | | | | |
| EP | | 0 795 978 A2 | 9/1997 | ............ H04L/5/06 | | | | |
| EP | | 0 795 955 A2 A3 | 9/1997 | .......... H03D/13/00 | | | | |
| EP | | 0 817 369 A2 A3 | 1/1998 | ............ H03D/7/00 | | | | |
| EP | | 0 837 565 A1 | 4/1998 | ............ H04B/1/69 | | | | |
| EP | | 0 862 274 A1 | 9/1998 | ............ H03M/1/06 | | | | |
| EP | | 0 874 499 A2 | 10/1998 | ............ H04L/25/06 | | | | |

Ali, I. et al., "Doppler Characterization for LEO Satellites," *IEEE Transactions on Communications*, IEEE, vol. 46, No. 3, pp. 309–313 (Mar. 1998).

Allan, D.W., "Statistics of Atomic Frequency Standards," *Proceedings of the IEEE Special Issue on Frequency Stability*, IEEE, pp. 221–230 (Feb. 1966).

Allstot, D.J. et al., "MOS Switched Capacitor Ladder Filters," *IEEE Journal of Solid–State Circuits*, IEEE, vol. SC–13, No. 6, pp. 806–814 (Dec. 1978).

Allstot, D.J. and Black, Jr. W.C., "Technological Design Considerations for Monolithic MOS Switched–Capacitor Filtering Systems," *Proceedings of the IEEE*, IEEE, vol. 71, No. 8, pp. 967–986 (Aug. 1983).

Alouini, M. et al., "Channel Characterization and Modeling for Ka–Band Very Small Aperture Terminals," *Proceedings of the IEEE*, IEEE, vol. 85, No. 6, pp. 981–997 (Jun. 1997).

Andreyev, G.A. and Ogarev, S.A., "Phase Distortions of Keyed Millimeter–Wave Signals in the Case of Propagation in a Turbulent Atmosphere," *Telecommunications and Radio Engineering*, Scripta Technica, vol. 43, No. 12, pp. 87–90 (Dec. 1988).

Antonetti, A. et al., "Optoelectronic Sampling in the Picosecond Range," *Optics Communications*, North–Holland Publishing Company, vol. 21, No. 2, pp. 211–214 (May 1977).

Austin, J. et al., "Doppler Correction of the Telecommunication Payload Oscillators in the UK T–SAT," *18th European Microwave Conference*, Microwave Exhibitions and Publishers Ltd., pp. 851–857 (Sep. 12–15, 1988).

Auston, D.H., "Picosecond optoelectronic switching and gating in silicon," *Applied Physics Letters*, American Institute of Physics, vol. 26, No. 3, pp. 101–103 (Feb. 1, 1975).

Baher, H., "Transfer Functions for Switched–Capacitor and Wave Digital Filters," *IEEE Transactions on Circuits and Systems*, IEEE Circuits and Systems Society, vol. CAS–33, No. 11, pp. 1138–1142 (Nov. 1986).

Baines, R., "The DSP Bottleneck," *IEEE Communications Magazine*, IEEE Communications Society, pp. 46–54 (May 1995).

Banjo, O.P. and Vilar, E., "Binary Error Probabilities on Earth–Space Links Subject to Scintillation Fading," *Electronics Letters*, IEE, vol. 21, No. 7, pp. 296–297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277–280 (Mar. 30 –Apr. 2, 1987).

Banjo, O.P. and Vilar, E. "Measurement and Modeling of Amplitude Scintillations on Low–Elevation Earth–Space Paths and Impact on Communication Systems," *IEEE Transactions on Communications*, IEEE Communications Society, vol. COM–34, No. 8, pp. 774–780 (Aug. 1986).

Banjo, O.P. et al., "Tropospheric Amplitude Spectra Due to Absorption and Scattering in Earth–Space Paths," *Fourth International Conference on Antennas and Propagation (ICAP 85)*, IEE, pp. 77–82 (Apr. 16–19, 1985).

Basili, P. et al., "Case Study of Intense Scintillation Events on the OTS Path," *IEEE Transactions on Antennas and Propagation*, IEEE, vol. 38, No. 1, pp. 107–113 (Jan. 1990).

Basili, P. et al., "Observation of High $C^2$ and Turbulent Path Length on OTS Space–Earth Link," *Electronics Letters*, IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters*, IEE, vol. 21, No. 11, pp. 486–487 (May 23, 1985).

Burgueño, A. et al., "Influence of rain gauge integration time on the rain rate statistics used in microwave communications," *annales des télècommunications*, International Union of Radio Science, pp. 522–527 (Sep./Oct. 1988).

Burgueño, A. et al., "Long–Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198–201 (Mar. 30–Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297–301 (Apr. 4–7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359–1366 (Sep. 1990).

Catalan, C. and Vilar, E., "Approach for satellite slant path remote sensing," *Electronics Letters*, IEE, vol. 34, No. 12, pp. 1238–1240 (Jun. 11, 1998).

Chan, P. et al., "A Highly Linear 1–GHz CMOS Downconversion Mixer," *European Solid State Circuits Conference*, IEEE Communication Society, pp. 210–213 (Sep. 22–24, 1993).

Copy of Declaration of Michael J. Bultman filed in patent application Ser. No. 09/176,022, which is directed to related subject matter.

Copy of Declaration of Robert W. Cook filed in patent application Ser. No. 09/176,022, which is directed to related subject matter.

Copy of Declaration of Alex Holtz filed in patent application Ser. No. 09/176,022, which is directed to related subject matter.

Copy of Declaration of Richard C. Looke filed in patent application Ser. No. 09/176,022, which is directed to related subject matter.

Copy of Declaration of Charley D. Moses, Jr. filed in patent application Ser. No. 09/176,022, which is directed to related subject matter.

Copy of Declaration of Jeffrey L. Parker and David F. Sorrells, with attachment Exhibit 1, filed in patent application Ser. No. 09/176,022, which is directed to related subject matter.

Dewey, R.J. and Collier, C.J., "Multi–Mode Radio Receiver," *Electronics Division Colloquium on Digitally Implemented Radios*, IEE, pp. 3/1–3/5 (Oct. 18, 1985).

DIALOG File 347 (JAPIO) English Language Patent Abstract for JP 2–276351, published Nov. 13, 1990, (1 page).

DIALOG File 347 (JAPIO) English Language Patent Abstract for JP 2–131629, published May 21, 1990, (1 page).

DIALOG File 347 (JAPIO) English Language Patent Abstract for JP 2–39632, published Feb. 8, 1990, (1 page).

DIALOG File 348 (European Patents) English Language Patent Abstract for EP 0 785 635 A1, published Dec. 26, 1996, (3 pages).

DIALOG File 348 (European Patents) English Language Patent Abstract for EP 35166 A1, published Feb. 18, 1981, (2 pages).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET–Less Sample–and–Hold with High Charge–to–Droop Current Ratio," *IEEE Journal of Solid–State Circuits*, IEEE, vol. SC–13, No. 6, pp. 864–873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM–32, No. 1, pp. 208–213 (Mar. 1983).

Faulkner, N.D. et al., "Sub–Harmonic Sampling for the Accurate Measuremnet of Frequency Stability of Microwave Oscillators," *CPEM 82 Digest: Conference on Precision Electromagnetic Measurements*, IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurements*, IEEE, pp. 81–82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958–1965 (Nov. 1990).

Fukahori, K., "A CMOS Narrow–Band Signaling Filter with Q Reduction," *IEEE Journal of Solid–State Circuits*, IEEE, vol. SC-19, No. 6, pp. 926–932 (Dec. 1984).

Fukuchi, H. and Otsu, Y., "Available time statistics of rain attenuation on earth–space path," *IEE Proceedings—H: Microwaves, Antennas and Propagation*, IEE, vol. 135, Pt. H, No. 6, pp. 387–390 (Dec. 1988).

Gibbins, C.J. and Chadha, R., "Millimetre–wave propagation through hydrocarbon flame," *IEE Proceedings*, IEE, vol. 134, Pt. H, No.2, pp. 169–173 (Apr. 1987).

Gilchrist, B. et al., "Sampling hikes performance of frequency synthesizers," *Microwaves & RF*, Hayden Publishing, vol. 23, No. 1, pp. 93–94 and 110 (Jan. 1984).

Gossard, E.E., "Clear weather meteorological effects on propagation at frequencies above 1 Ghz," *Radio Science*, American Geophysical Union, vol. 16, No. 5, pp. 589–608 (Sep.–Oct. 1981).

Gregorian, R. et al., "Switched–Capacitor Circuit Design," *Proceedings of the IEEE*, IEEE, vol. 71, No. 8, pp. 941–966 (Aug. 1983).

Groshong et al., "Undersampling Techniques Simplify Digital Radio," *Electronic Design*, Penton Publishing, pp. 67–68, 70, 73–75 and 78 (May 23, 1991).

Grove, W.M., "Sampling for Oscilloscopes and Other RF Systems: Dc through X–Band," *IEEE Transactions on Microwave Theory and Techniques*, IEEE, pp. 629–635 (Dec. 1966).

Haddon, J. et al., "Measurement of Microwave Scintillations on a Satellite Down–Link at X–Band," *Antennas and Propagation*, IEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP–34, No. 5, pp. 646–657 (May 1986).

Hafdallah, H. et al., "2–4 Ghz MESFET Sampler," *Electronics Letters*, IEE, vol. 24, No. 3, pp. 151–153 (Feb. 4, 1988).

Herben, M.H.A.J., "Amplitude and Phase Scintillation Measurements on 8–2 km Line–Of–Sight Path at 30 Ghz," *Electronics Letters*, IEE, vol. 18, No. 7, pp. 287–289 (Apr. 1, 1982).

Hewitt, A. et al., "An 18 Ghz Wideband LOS Multipath Experiment," *International Conference on Measurements for Telecommunication Transmission Systems—MTTS 85*, IEE, pp. 112–116 (Nov. 27–28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136–1143 (Nov. 1989).

Hewitt, A. and Vilar, E., "Selective fading on LOS Microwave Links: Classical and Spread–Spectrum Measurement Techniques," *IEEE Transactions on Communications*, IEEE Communications Society, vol. 36, No. 7, pp. 789–796 (Jul. 1988).

Hospitalier, E., "Instruments for Recording and Observing Rapidly Varying Phenomena," *Science Abstracts*, IEE, vol. VII, pp. 22–23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115–121 (Sep. 18–20, 1990).

Hu, X., *A Switched–Current Sample–and–Hold Amplifier for FM Demodulation*, Thesis for Master of Applied Science, Dept. of Electrical and Computer Engineering, University of Toronto, UMI Dissertation Services, pp. 1–64 (1995).

Hung, H–L. A. et al., "Characterization of Microwave Integrated Circuits Using An Optical Phase–Locking and Sampling System," *IEEE MTT–S Digest*, IEEE, pp. 507–510 (1991).

Hurst, P.J., "Shifting the Frequency Response of Switched–Capacitor Filters by Nonuniform Sampling," *IEEE Transactions on Circuits and Systems*, IEEE Circuits and Systems Society, vol. 38, No. 1, pp. 12–19 (Jan. 1991).

Itakura, T., "Effects of the sampling pulse width on the frequency characteristics of a sample–and–hold circuit," *IEE Proceedings Circuits, Devices and Systems*, IEE, vol. 141, No. 4, pp. 328–336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52–59 (Aug. 1950).

Janssen, J.M.L. and Michels, A.J., "An Experimental 'Stroboscopic' Oscilloscope for Frequencies up to about 50 Mc/s: II. Electrical Build–Up," *Philips Technical Review*, Philips Research Laboratories, vol. 12, No. 3, pp. 73–82 (Sep. 1950).

Jondral, V.F. et al., "Doppler Profiles for Communication Satellites," *Frequenz*, Herausberger, pp. 111–116 (May–Jun. 1996).

Kaleh, G.K., "A Frequency Diversity Spread Spectrum System for Communication in the Presence of In–band Interference," *1995 IEEE Globecom*, IEEE Communications Society, pp. 66–70 (1995).

Karasawa, Y. et al., "A New Prediction Method for Tropospheric Scintillation on Earth–Space Paths," *IEEE Transactions on Antennas and Propagation*, IEEE Antennas and Propagation Society, vol. 36, No. 11, pp. 1608–1614 (Nov. 1988).

Kirsten, J. and Fleming, J., "Undersampling reduces data–acquisition costs for select applications," *EDN*, Cahners Publishing, vol. 35, No. 13, pp. 217–222, 224, 226–228 (Jun. 21, 1990).

Lam, W.K. et al., "Measurement of the Phase Noise Characteristics of an Unlocked Communications Channel Identifier," *Proceedings of the 1993 IEEE International Frequency Control Symposium*, IEEE, pp. 283–288 (Jun. 2–4, 1993).

Lam, W.K. et al., "Wideband sounding of 11.6 Ghz tranhorizon channel," *Electronics Letters*, IEE, vol. 30, No. 9, pp. 738–739 (Apr. 28, 1994).

Larkin, K.G., "Efficient demodulator for bandpass sampled AM signals," *Electronics Letters*, IEE, vol. 32, No. 2, pp. 101–102 (Jan. 18, 1996).

Lau, W.H. et al., "Analysis of the Time Variant Structure of Microwave Line–of–sight Multipath Phenomena," *IEEE Global Telecommunications Conference & Exhibition*, IEEE, pp. 1707–1711 (Nov. 28–Dec. 1, 1988).

Lau, W.H. et al., "Improved Prony Algorithm to Identify Multipath Components," *Electronics Letters*, IEE, vol. 23, No. 20, pp. 1059–1060 (Sep. 24, 1987).

Lesage, P. and Audoin, C., "Effect of Dead–Time on the Estimation of the Two–Sample Variance," *IEEE Transactions on Instrumentation and Measurement*, IEEE Instrumentation and Measurement Society, vol. IM–28, No. 1, pp. 6–10 (Mar. 1979).

Liechti, C.A., "Performance of Dual–gate GaAs MESFET's as Gain–Controlled Low–Noise Amplifiers and High–Speed Modulators," *IEEE Transactions on Microwave Theory and Techniques*, IEEE Microwave Theory and Techniques Society, vol. MTT–23, No. 6, pp. 461–469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS–26, No. 4, pp. 4443–4449 (Aug. 1979).

Liou, M.L., "A Tutorial on Computer–Aided Analysis of Switched–Capacitor Circuits," *Proceedings of the IEEE*, IEEE, vol. 71, No. 8, pp. 987–1005 (Aug. 1983).

Lo, P. et al., "Coherent Automatic Gain Control," *IEE Colloquium on Phase Locked Techniques*, IEE, pp. 2/1–2/6 (Mar. 26, 1980).

Lo, P. et al., "Computation of Rain Induced Scintillations on Satellite Down–Links at Microwave Frequencies," *Third International Conference on Antennas and Propagation (ICAP 83)*, pp. 127–131 (Apr. 12–15, 1983).

Lo, P.S.L.O. et al., "Observations of Amplitude Scintillations on a Low–Elevation Earth–Space Path," *Electronics Letters*, IEE, vol. 20, No. 7, pp. 307–308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960–1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592–594 (Aug. 7, 1989).

Martin, K. and Sedra, A.S., "Switched–Capacitor Building Blocks for Adaptive Systems," *IEEE Transactions on Circuits and Systems*, IEEE Circuits and Systems Society, vol. CAS–28, No. 6, pp. 576–584 (Jun. 1981).

Marzano, F.S. and d'Auria, G., "Model–based Prediction of Amplitude Scintillation variance due to Clear–Air Tropospheric Turbulence on Earth–Satellite Microwave Links," *IEEE Transactions on Antennas and Propagation*, IEEE Antennas and Propagation Society, vol. 46, No. 10, pp. 1506–1518 (Oct. 1998).

Matricciani, E., "Prediction of fade durations due to rain in satellite communication systems," *Radio Science*, American Geophysical Union, vol. 32, No. 3, pp. 935–941 (May–Jun. 1997).

McQueen, J.G., "The Monitoring of High–Speed Waveforms," *Electronic Engineering*, Morgan Brothers Limited, vol. XXIV, No. 296, pp. 436–441 (Oct. 1952).

Merkelo, J. and Hall, R.D., "Broad–Band Thin–Film Signal Sampler," *IEEE Journal of Solid–State Circuits*, IEEE, vol. SC–7, No. 1, pp. 50–54 (Feb. 1972).

Merlo, U. et al., "Amplitude Scintillation Cycles in a Sirio Satellite–Earth Link," *Electronics Letters*, IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics*, Springer–Verlag, vol. 203, No. 2, pp. 399–406 (Sep. (11), 1988).

Moulsley, T.J. et al., "The efficient acquisition and processing of propagation statistics," *Journal of the Institution of Electronic and Radio Engineers*, IERE, vol. 55, No. 3, pp. 97–103 (Mar. 1985).

Ndzi, D. et al., "Wide–Band Statistical Characterization of an Over–the–Sea Experimental Transhorizon Link," *IEE Colloquium on Radio Communications at Microwave and Millimetre Wave Frequencies*, IEE, pp. 1/1–1/6 (Dec. 16, 1996).

Ndzi, D. et al., "Wideband Statistics of Signal Levels and Doppler Spread on an Over–The–Sea Transhorizon Link," *IEE Colloquium on Propagation Characteristics and Related System Technqiues for Beyond Line–of–Sight Radio*, IEE, pp. 9/1–9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130–135 (Apr. 12, 1979).

Oppenheim, A.V. et al., *Signals and Systems*, Prentice–Hall, pp. 527–531 and 561–562 (1983).

Ortgies, G., "Experimental Parameters Affecting Amplitude Scintillation Measurements on Satellite Links," *Electronics Letters*, IEE, vol. 21, No. 17, pp. 771–772 (Aug. 15, 1985).

Pärssinen et al., "A 2–GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear–Air Scintillation Prediction Using Olympus Satellite Measurements," *International Journal of Satellite Communications*, John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate*, U.S. Dept. of Commerce, pp. 1–14 (May 1980).

Poulton, K. et al., "A 1–Ghz 6–bit ADC System," *IEEE Journal of Solid–State Circuits*, IEEE, vol. SC–22, No. 6, pp. 962–969 (Dec. 1987).

Press Release, "Parkervision, Inc. Announces Fiscal 1993 Results," Lippert/Heilshorn and Associates, 2 pages (Apr. 6, 1994).

Press Release, "Parkervision, Inc. Announces the Appointment of Michael Baker to the New Position of National Sales Manager," Lippert/Heilshorn and Associates, 1 page (Apr. 7, 1994).

Press Release, "Parkervision's Cameraman Well–Received by Distance Learning Market," Lippert/Heilshorn and Associates, 2 pages (Apr. 8, 1994).

Press Release, "Parkervision, Inc. Announces First Quarter Financial Results," Lippert/Heilshorn and Associates, 2 pages (Apr. 26, 1994).

Press Release, "Parkervision, Inc. Announces the Retirement of William H. Fletcher, Chief Financial Officer," Lippert/Heilshorn and Associates, 1 page (May 11, 1994).

Press Release, "Parkervision, Inc. Announces New Cameraman System II™ At Infocomm Trade Show," Lippert/Heilshorn and Associates, 3 pages (Jun. 9, 1994).

Press Release, "Parkervision, Inc. Announces Appointments to its National Sales Force," Lippert/Heilshorn and Associates, 2 pages (Jun. 17, 1994).

Press Release, "Parkervision, Inc. Announces Second Quarter and Six Months Financial Results," Lippert/Heilshorn and Associates, 3 pages (Aug. 9, 1994).

Press Release, "Parkervision, Inc. Announces Third Quarter and Nine Months Financial Results," Lippert/Heilshorn and Associates, 3 pages (Oct. 28, 1994).

Press Release, "Parkervision, Inc. Announces First Significant Dealer Sale of Its Cameraman® System II," Lippert/Heilshorn and Associates, 2 pages (Nov. 7, 1994).

Press Release, "Parkervision, Inc. Announces Fourth Quarter and Year End Results," Lippert/Heilshorn and Associates, 2 pages (Mar. 1, 1995).

Press Release, "Parkervision, Inc. Announces Joint Product Developments with VTEL," Lippert/Heilshorn and Associates, 2 pages (Mar. 21, 1995).

Press Release, "Parkervision, Inc. Announces First Quarter Financial Results," Lippert/Heilshorn and Associates, 3 pages (Apr. 28, 1995).

Press Release, "Parkervision Wins Top 100 Product Districts' Choice Award," Parkervision Marketing and Manufacturing Headquarters, 1 page (Jun. 29, 1995).

Press Release, "Parkervision National Sales Manager Next President of USDLA," Parkervision Marketing and Manufacturing Headquarters, 1 page (Jul. 6, 1995).

Press Release, "Parkervision Granted New Patent," Parkervision Marketing and Manufacturing Headquarters, 1 page (Jul. 21, 1995).

Press Release, "Parkervision, Inc. Announces Second Quarter and Six Months Financial Results," Parkervision Marketing and Manufacturing Headquarters, 2 pages (Jul. 31, 1995).

Press Release, "Parkervision, Inc. Expands Its Cameraman System II Product Line," Parkervision Marketing and Manufacturing Headquarters, 2 pages (Sep. 22, 1995).

Press Release, "Parkervision Announces New Camera Control Technology," Parkervision Marketing and Manufacturing Headquarters, 2 pages (Oct. 25, 1995).

Press Release, "Parkervision, Inc. Announces Completion of VTEL/Parkervision Joint Product Line", Parkervision Marketing and Manufacturing Headquarters, 2 pages (Oct. 30, 1995).

Press Release, "Parkervision, Inc. Announces Third Quarter and Nine Months Financial Results," Parkervision Marketing and Manufacturing Headquarters, 2 pages (Oct. 30, 1995).

Press Release, "Parkervision's Cameraman Personal Locator Camera System Wins Telecon XV Award," Parkervision Marketing and Manufacturing Headquarters, 2 pages (Nov. 1, 1995).

Press Release, "Parkervision, Inc. Announces Purchase Commitment From VTEL Corporation," Parkervision Marketing and Manufacturing Headquarters, 1 page (Feb. 26, 1996).

Press Release, "ParkerVision, Inc. Announces Fourth Quarter and Year End Results," Parkervision Marketing and Manufacturing Headquarters, 2 pages (Feb. 27, 1996).

Press Release, "ParkerVision, Inc. Expands its Product Line," Parkervision Marketing and Manufacturing Headquarters, 2 pages (Mar. 7, 1996).

Press Release, "ParkerVision Files Patents for its Research of Wireless Technology," Parkervision Marketing and Manufacturing Headquarters, 1 page (Mar. 28, 1996).

Press Release, "Parkervision, Inc. Announces First Significant Sale of Its Cameraman® Three–Chip System," Parkervision Marketing and Manufacturing Headquarters, 2 pages (Apr. 12, 1996).

Press Release, "Parkervision, Inc. Introduces New Product Line For Studio Production Market," Parkervision Marketing and Manufacturing Headquarters, 2 pages (Apr. 15, 1996).

Press Release, "Parkervision, Inc. Announces Private Placement of 800,000 Shares," Parkervision Marketing and Manufacturing Headquarters, 1 page (Apr. 15, 1996).

Press Release, "Parkervision, Inc. Announces First Quarter Financial Results," Parkervision Marketing and Manufacturing Headquarters, 3 pages (Apr. 30, 1996).

Press Release, "ParkerVision's New Studio Product Wins Award," Parkervision Marketing and Manufacturing Headquarters, 2 pages (Jun. 5, 1996).

Press Release, "Parkervision, Inc. Announces Second Quarter and Six Months Financial Results," Parkervision Marketing and Manufacturing Headquarters, 3 pages (Aug. 1, 1996).

Press Release, "Parkervision, Inc. Announces Third Quarter and Nine Months Financial Results," Parkervision Marketing and Manufacturing Headquarters, 2 pages (Oct. 29, 1996).

Press Release, "PictureTel and ParkerVision Sign Reseller Agreement," Parkervision Marketing and Manufacturing Headquarters, 2 pages (Oct. 30, 1996).

Press Release, "CLI and ParkerVision Bring Enhanced Ease–of–Use to Videoconferencing," CLI/Parkervision, 2 pages (Jan. 20, 1997).

Press Release, "Parkervision, Inc. Announces Fourth Quarter and Year End Results," Parkervision Marketing and Manufacturing Headquarters, 3 pages (Feb. 27, 1997).

Press Release, "Parkervision, Inc. Announces First Quarter Financial Results," Parkervision Marketing and Manufacturing Headquarters, 3 pages (Apr. 29, 1997).

Press Release, "NEC and Parkervision Make Distance Learning Closer," NEC America, 2 pages (Jun. 18, 1997).

Press Release, "Parkervision Supplies JPL with Robotic Cameras, Cameraman Shot Director for Mars Mission," Parkervision Marketing and Manufacturing Headquarters, 2 pages (Jul. 8, 1997).

Press Release, "ParkerVision and IBM Join Forces to Create Wireless Computer Peripherals," Parkervision Marketing and Manufacturing Headquarters, 2 pages (Jul. 23, 1997).

Press Release, "ParkerVision, Inc. Announces Second Quarter and Six Months Financial Results," Parkervision Marketing and Manufacturing Headquarters, 3 pages (Jul. 31, 1997).

Press Release, "Parkervision, Inc. Announces Private Placement of 990,000 Shares," Parkervision Marketing and Manufacturing Headquarters, 2 pages (Sep. 8, 1997).

Press Release, "Wal–Mart Chooses Parkervision for Broadcast Production," Parkervision Marketing and Manufacturing Headquarters, 2 pages (Oct. 24, 1997).

Press Release, "Parkervision, Inc. Announces Third Quarter Financial Results," Parkervision Marketing and Manufacturing Headquarters, 3 pages (Oct. 30, 1997).

Press Release, "ParkerVision Announces Breakthrough in Wireless Radio Frequency Technology," Parkervision Marketing and Manufacturing Headquarters, 3 pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 pages (Jan. 9, 1998).

Press Release, "Parkervision Announces Existing Agreement with IBM Terminates—Company Continues with Strategic Focus Announced in December," Parkervision Marketing and Manufacturing Headquarters, 2 pages (Jan. 27, 1998).

Press Release, "Laboratory Tests Verify Parkervision Wireless Technology," Parkervision Marketing and Manufacturing Headquarters, 2 pages (Mar. 3, 1998).

Press Release, "Parkervision, Inc. Announces Fourth Quarter and Year End Financial Results," Parkervision Marketing and Manufacturing Headquarters, 3 pages (Mar. 5, 1998).

Press Release, "Parkervision Awarded Editors' Pick of Show for NAB 98," Parkervision Marketing and Manufacturing Headquarters, 2 pages (Apr. 15, 1998).

Press Release, "Parkervision Announces First Quarter Financial Results," Parkervision Marketing and Manufacturing Headquarters, 3 pages (May 4, 1998).

Press Release, "Parkervision 'DIRECT2DATA' Introduced in Response to Market Demand," Parkervision Marketing and Manufacturing Headquarters, 3 pages (Jul. 9, 1998).

Press Release, "Parkervision Expands Senior Management Team," Parkervision Marketing and Manufacturing Headquarters, 2 pages (Jul. 29, 1998).

Press Release, "Parkervision Announces Second Quarter and Six Month Financial Results," Parkervision Marketing and Manufacturing Headquarters, 4 pages (Jul. 30, 1998).

Press Release, "Parkervision Announces Third Quarter and Nine Month Financial Results," Parkervision Marketing and Manufacturing Headquarters, 3 pages (Oct. 30, 1998).

Press Release, "Questar Infocomm, Inc. Invests $5 Million in Parkervision Common Stock," Parkervision Marketing and Manufacturing Headquarters, 3 pages (Dec. 2, 1998).

Press Release, "Parkervision Adds Two New Directors," Parkervision Marketing and Manufacturing Headquarters, 2 pages (Mar. 5, 1999).

Press Release, "Parkervision Announces Fourth Quarter and Year End Financial Results," Parkervision Marketing and Manufacturing Headquarters, 3 pages (Mar. 5, 1999).

Press Release, "Joint Marketing Agreement Offers New Automated Production Solution," Parkervision Marketing and Manufacturing Headquarters, 2 pages (Apr. 13, 1999).

"Project COST 205: Scintillatious in Earth–satellite links," *Alta Frequenza: Scientific Review in Electronics*, AEI, vol. LIV, No. 3, pp. 209–211 (May–Jun., 1985).

Razavi, B., *RF Microelectronics*, Prentice–Hall, pp. 147–149 (1998).

Reeves, R.J.D., "The Recording and Collocation of Waveforms (Part 1)," *Electronic Engineering*, Morgan Brothers Limited, vol. 31, No. 373, pp. 130–137 (Mar. 1959).

Reeves, R.J.D., "The Recording and Collocation of Waveforms (Part 2)," *Electronic Engineering*, Morgan Brothers Limited, vol. 31, No. 374, pp. 204–212 (Apr. 1959).

Rein, H.M. and Zahn, M., "Subnanosecond–Pulse Generator with Variable Pulsewidth Using Avalanche Transistors," *Electronics Letters*, IEE, vol. 11, No. 1, pp. 21–23 (Jan. 9, 1975).

Riad, S.M. and Nahman, N.S., "Modeling of the Feed–through Wideband (DC to 12.4 Ghz) Sampling–Head," *IEEE MTT–S International Microwave Symposium Digest*, IEEE, pp. 267–269 (Jun. 27–29, 1978).

Rizzoli, V. et al., "Computer–Aided Noise Analysis of MESFET and HEMT Mixers," *IEEE Transactions on Microwave Theory and Techniques*, IEEE, vol. 37, No. 9, pp. 1401–1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelman, F., "Effect of Antenna Size on OTS Signal Scintillations and Their Seasonal Dependence," *Electronics Letters*, IEE, vol. 19, No. 24, pp. 1032–1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238–242 (Oct. 25–27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218–223 (Oct. 16–18, 1990).

Salous, S., "IF digital generation of FMCW waveforms for wideband channel characterization," *IEE Proceedings–I*, IEE, vol. 139, No. 3, pp. 281–288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched–Capacitor Biquad," *Proceedings of the IEEE*, IEEE, vol. 71, No. 8, pp. 1008–1009 (Aug. 1983).

Saul, P.H., "A GaAs MESFET Sample and Hold Switch," *Fifth European Solid State Circuits Conference—ESSCIRC 79*, IEE, pp. 5–7 (1979).

Shen, D.H. et al., "A 900–MHZ RF Front–End with Integrated Discrete–Time Filtering," *IEEE Journal of Solid–State Circuits*, IEEE Solid–State Circuits Council, vol. 31, No. 12, pp. 1945–1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467–1479 (Sep.–Oct. 1995).

Shen, X. and Tawfik, A.N., "Dynamic Behavior of Radio Channels Due to Trans–Horizon Propagation Mechanisms," *Electronics Letters*, IEE, vol. 29, No. 17, pp. 1582–1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1–4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259–261 (Feb. 1, 1996).

Shen, D. et al., "A 900 MHZ Integrated Discrete–Time Filtering RF Front–End," *IEEE International Solid State Circuits Conference*, IEEE, vol. 39, pp. 54–55 and 417 (Feb. 1996).

Spillard, C. et al., "X–Band Tropospheric Transhorizon Propagation Under Differing Meteorological Conditions," *Sixth International Conference on Antennas and Propagation (ICAP 89) Part 2: Propagation*, IEE, pp. 451–455 (Apr. 4–7, 1989).

Stafford, K.R. et al., "A Complete Monolithic Sample/Hold Amplifier," *IEEE Journal of Solid–State Circuits*, IEEE, vol. SC–9, No. 6, pp. 381–387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw–Hill, pp. 106–110 (Mar. 27, 1972).

Sugarman, R., "Sampling Oscilloscope for Statistically Varying Pulses," *The Review of Scientific Instruments*, American Institute of Physics, vol. 28, No. 11, pp. 933–938 (Nov. 1957).

Sylvain, M., "Experimental probing of multipath microwave channels," *Radio Science*, American Geophysical Union, vol. 24, No. 2, pp. 160–178 (Mar.–Apr. 1989).

Takano, T., "NOVEL GaAs Pet Phase Detector Operable to Ka Band," *IEEE MT–S Digest*, IEEE, pp. 381–383 (1984).

Tan, M.A., "Biquadratic Transconductance Switched–Capacitor Filters," *IEEE Transactions on Circuits and Systems—I: Fundamental Theory and Applications*, IEEE Circuits and Systems Society, vol. 40, No. 4, pp. 272–275 (Apr. 1993).

Tanaka, K. et al., "Single Chip Multisystem AM Stereo Decoder IC," *IEEE Transactions on Consumer Electronics*, IEEE Consumer Electronics Society, vol. CE–32, No. 3, pp. 482–496 (Aug. 1986).

Tawfik, A.N., "Amplitude, Duration and Predictability of Long Hop Trans–Horizon X–band Signals Over the Sea," *Electronics Letters*, IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters," *Eighth International Conference on Antennas and Propagation*, Electronics Divison of the IEE, pp. 335–339 (Mar. 30–Apr. 2, 1993).

Tawfik, A.N. and Vilar, E., "Dynamic Structure of a Transhorizon Signal at X–band Over a Sea Path," *Sixth International Conference on Antennas and Propagation (ICAP 89) Part 2: Propagation*, IEE, pp. 446–450 (Apr. 4–7, 1989).

Tawfik, A.N. and Vilar, E., "Statistics of Duration and Intensity of Path Loss in a Microwave Transhorizon Sea–Path," *Electronics Letters*, IEE, vol. 26, No. 7, pp. 474–476 (Mar. 29, 1990).

Tawfik, A.N. and Vilar, E., "X–Band Transhorizon Measurements of CW Transmissions Over the Sea—Part 1: Path Loss, Duration of Events, and Their Modeling," *IEEE Transactions on Antennas and Propagation*, IEEE Antennas and Propagation Society, vol. 41, No. 11, pp. 1491–1500 (Nov. 1993).

Temes, G.C. and Tsividis, T., "The Special Section on Switched–Capacitor Circuits," *Proceedings of the IEEE*, IEEE, vol. 71, No. 8, pp. 915–916 (Aug. 1983).

Thomas, G.B., *Calculus and Analytic Geometry*, Third Edition, Addison–Wesley Publishing, pp. 119–133 (1960).

Tomassetti, Q., "An Unusual Microwave Mixer," *16th European Microwave Conference*, Microwave Exhibitions and Publishers, pp. 754–759 (Sep. 8–12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1–3 (Jan. 1984).

Tsividis, Y. and Antognetti, P. (Ed.), *Design of MOS VLSI Circuits for Telecommunications*, Prentice–Hall, p. 304 (1985).

Tsividis, Y., "Principles of Operation and Analysis of Switched–Capacitor Circuits," *Proceedings of the IEEE*, IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference*, IEEE Vehicular Technology Society, pp. 457–462 (May 19–22, 1991).

Valdmanis, J. A. et al., "Picosecond and Subpicosend Optoelectronics for Measurements of Future High Speed Electronic Devices," *IEDM Technical Digest*, IEEE, pp. 597–600 (Dec. 5–7, 1983).

van de Kamp, M.M.J.L., "Asymmetric signal level distribution due to tropospheric scintillation," *Electronics Letters*, IEE, vol. 34, No. 11, pp. 1145–1146 (May 28, 1998).

Vasseur, H. and Vanhoenacker, D., "Characterization of tropospheric turbulent layers from radiosonde data," *Electronics Letters*, IEE, vol. 34, No. 4, pp. 318–319 (Feb. 19, 1998).

Verdone, R., "Outage Probability Analysis for Short–Range Communication Systems at 60 Ghz in ATT Urban Environments," *IEEE Transactions on Vehicular Technology*, IEEE Vehicular Technology Society, vol. 46, No. 4, pp. 1027–1039 (Nov. 1997).

Vierira–Ribeiro, S.A., *Single–IF DECT Receiver Architecture using a Quadrature Sub–Sampling Band–Pass Sigma–Delta Modulator*, Thesis for Degree of Master's of Engineering, Carleton University, UMI Dissertation Services, pp. 1–180 (Apr. 1995).

Vilar, E. et al., "A Comprehensive/Selective MM–Wave Satellite Downlink Experiment on Fade Dynamics," *Tenth International Conference on Antennas and Propagation*, Electronics Division of the IEE, pp. 2.98–2.101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8–1 –8–16 (Oct. 4–7, 1983).

Vilar, E. and Smith, H., "A Theoretical and Experimental Study of Angular Scintillations in Earth Space Paths," *IEEE Transactions on Antennas and Propagation*, IEEE, vol. AP–34, No. 1, pp. 2–10 (Jan. 1986).

Vilar, E. et al., "A Wide Band Transhorizon Experiment at 11.6 Ghz," *Eighth International Conference on Antennas and Propagation*, Electronics Division of the IEE, pp. 441–445 (Mar. 30–Apr. 2, 1993).

Vilar, E. and Matthews, P.A., "Amplitude Dependence of Frequency in Oscillators," *Electronics Letters*, IEE, vol. 8, No. 20, pp. 509–511 (Oct. 5, 1972).

Vilar, E. et al., "An experimental mm–wave receiver system for measuring phase noise due to atmospheric turbulence," *Proceedings of the 25th European Microwave Conference*, Nexus House, pp. 114–119 (1995).

Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83–88 (Apr. 16–19, 1985).

Vilar, E., "Antennas and Propagation: A Telecommunications Systems Subject," *Electronics Division Colloquium on Teaching Antennas and Propagation to Undergraduates*, IEE, pp. 7/1–7/6 (Mar. 8, 1988).

Vilar, E. et al., "CERS*. Millimetre–Wave Beacon Package and Related Payload Doppler Correction Strategies," *Electronics Division Colloquium on CERS—Communications Engineering Research Satellite*, IEE, pp. 10/1–10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620–622 (Jul. 4, 1985).

Vilar, E. et al., "Comparison of Rainfall Rate Duration Distributions for ILE–IFE and Barcelona," *Electronics Letters*, IEE, vol. 28, No. 20, pp. 1922–1924 (Sep. 24, 1992).

Vilar, E., "Depolarization and Field Transmittances in Indoor Communications," *Electronics Letters*, IEE, vol. 27, No. 9, pp. 732–733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150–154 (Apr. 4–7, 1989).

Vilar, E. et al., "Experimental System and Measurements of Transhorizon Signal Levels at 11 Ghz," $18^{th}$ *European Microwave Conference*, Microwave Exhibitions and Publishers Ltd., pp. 429–435 (Sep. 12–15, 1988).

Vilar, E. and Matthews, P.A., "Importance of Amplitude Scintillations in Millimetric Radio Links," *Proceedings of the $4^{th}$ European Microwave Conference*, Microwave Exhibitions and Publishers, pp. 202–206 (Sep. 10–13, 1974).

Vilar, E. and Haddon, J., "Measurement and Modeling of Scintillation Intensity to Estimate Turbulence Parameters in an Earth–Space Path," *IEEE Transactions on Antennas and Propagation*, IEEE Antennas and Propagation Society, vol. AP–32, No. 4, pp. 340–346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566–568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, IEE, pp. 5/1–5/8 (Jan. 17, 1991).

Vilar, E. and Faulkner, N.D., "Phase Noise and Frequency Stability Measurments. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronics Letters*, IEE, vol. 33, No. 22, pp. 1901–1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230–2.233 (Apr. 14–17, 1997).

Vilar, E. and Haddon, J., "Scintillation Modeling and Measurement—A Tool for Remote–Sensing Slant Paths," *AGARD Conference Proceedings No. 332: Propagation Aspects of Frequency Sharing, Interference and System Diversity*, AGARD, pp. 27–1 –27–13 (Oct. 18–22, 1982).

Vilar, E., "Some Limitations on Digital Transmission Through Turbulent Atmosphere," *International Conference on Satellite Communication Systems Technology*, Electronics Division of the IEE, pp. 169–187 (Apr. 7–10, 1975).

Vilar, E. and Matthews, P.A., "Summary of Scintillation Observations in a 36 Ghz Link Across London," *International Conference on Antennas and Propagation Part 2: Propagation*, IEE, pp. 36–40 (Nov. 28–30, 1978).

Vilar, E. et al., "Wideband Characterization of Scattering Channels," *Tenth International Conference on Antennas and Propagation*, Electronics Division of the IEE, pp. 2.353–2.358 (Apr. 14–17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1–11 (Nov. 1986).

Wan, K.W. et al., "A Novel Approach to the Simultaneous Measurement of Phone and Amplitude Noises in Oscillator," *Proceedings of the $19^{th}$ European Microwave Conference*, Microwave Exhibitions and Publishers Ltd., pp. 809–813 (Sep. 4–7, 1989).

Wan, K.W. et al., "Extended Variances and Autoregressive/Moving Average Algorithm for the Measurement and Synthesis of Oscillator Phase Noise," *Proceedings of the $43^{rd}$ Annual Symposium on Frequency Control*, IEEE, pp. 331–335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1–3/5 (Dec. 3, 1993).

Wang, H., "A 1–V Multigigahertz RF Mixer Core in 0.5–$\mu$m CMOS," *IEEE Journal of Solid–State Circuits*, IEEE Solid–State Circuits Society, vol. 33, No. 12, pp. 2265–2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367–373 (Apr. 22nd–26th, 1985).

Weast, R.C. et al. (Ed.), *Handbook of Mathematical Tables*, Second Edition, The Chemical Rubber Co., pp. 480–485 (1964).

Wiley, R.G., "Approximate FM Demodulation Using Zero Crossings," *IEEE Transactions on Communications*, IEEE, vol. COM–29, No. 7, pp. 1061–1065 (Jul. 1981).

Worthman, W., "Convergence . . . Again," *RF Design*, Primedia, p. 102 (Mar. 1999).

Young, I.A. and Hodges, D.A., "MOS Switched–Capacitor Analog Sampled–Data Direct–Form Recursive Filters," *IEEE Journal of Solid–State Circuits*, IEEE, vol. SC–14, No. 6, pp. 1020–1033 (Dec. 1979).

Translation of Specification and Claims of FR Patent No. 2245130, 3 pages.

Fest, Jean–Pierre , "Le Convertisseur A/N Revolutionne Le Recepteur Radio," *Electronique*, JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd., pp. 146–154 (Apr. 30, 1956).

Miki, S. and Nagahama, R., *Modulation System II*, Common Edition 7, Kyoritsu Publishing Co., Ltd., pp. 146–149 (Apr. 30, 1956). (Partial Translation of Doc. AQ51).

Rabiner, L.R. and Gold, B., *Theory and Application of Digital Signal Processing*, Prentice–Hall, Inc., pp. xiii–xii and 40–46 (1975).

English–language Abstract of JP 08–032556, published Feb. 2, 1996, from *http://www1.ipdl.jpo.go.jp*, 2 pages (last visited Dec. 14, 2001).

English–language Abstract of JP 08–139524, published May 31, 1996, from *http://www1.ipdl.jpo.go.jp*, 2 pages (last visited Dec. 14, 2001).

English–language Abstract of JP 59–144249, published Aug. 18, 1984, from *http://www1.ipdl.jpo.go.jp*, 2 pages (last visited Jan. 2, 2002).

English–language Abstract of JP 63–054002, published Mar. 8, 1988, from *http://www1.ipdl.jpo.go.jp*, 2 pages (last visited Jan. 2, 2002).

English–language Abstract of JP 06–237276, published Aug. 23, 1994, from *http://www1.ipdl.jpo.go.jp*, 2 pages (last visited Jan. 2, 2002).

English–language Abstract of JP 08–023359, published Jan. 23, 1996, from *http://www1.ipdl.jpo.go.jp*, 2 pages (last visited Jan. 2, 2002).

Razavi, B., A 900–MHz/1.8–Ghz CMOS Transmitter for Dual–Band Applications, *Symposium on VLSI Circuits Digest of Technical Papers*, IEEE, pp. 128–131 (1998).

Ritter, G.M., "SDA, A New Solution for Transceivers," *16th European Microwave Conference*, Microwave Exhibitions and Publishers, pp. 729–733 (Sep. 8, 1986).

Translation of Japanese Patent Publication No. 47–2314, 3 pages.

Partial Translation of Japanese Patent Publication No. 58–7903, 3 pages.

English–language Abstract of Japanese Patent Publication No. 58–133004, from *http://www1.ipdl.jpo.go.jp*, 2 pages (Aug. 8, 1993—Date of publication of application).

English–language Abstract of Japanese Patent Publication No. 60–058705, from *http://www1.ipdl.jpo.go.jp*, 1 page (Apr. 4, 1985—Date of publication of application).

English–language Abstract of Japanese Patent Publication No. 04–123614, from *http://www1.ipdl.jpo.go.jp*, 1 page (Apr. 23, 1992—Date of publication of application).

English–language Abstract of Japanese Patent Publication No. 04–127601, from *http://www1.ipdl.jpo.go.jp*, 1 page (Apr. 28, 1992—Date of publication of application).

English–language Abstract of Japanese Patent Publication No. 05–175730, from *http://www1.ipdl.jpo.go.jp*, 1 page (Jul. 13, 1993—Date of publication of application).

English–language Abstract of Japanese Patent Publication No. 05–175734, from *http://www1.ipdl.jpo.go.jp*, 1 page (Jul. 13, 1993—Date of publication of application).

English–language Abstract of Japanese Patent Publication No. 07–154344, from *http://www1.ipdl.jpo.go.jp*, 2 pages (Jun. 16, 1995—Date of publication of application).

English–language Abstract of Japanese Patent Publication No. 07–307620, from *http://www1.ipdl.jpo.go.jp*, 1 page (Nov. 21, 1995—Date of publication of application).

Oppenheim, A.V. and Schafer, R.W., *Digital Signal Processing*, Prentice–Hall, pp. vii–x, 6–35, 45–78, 87–121 and 136–165 (1975).

English–language Abstract of Japanese Patent Publication No. 55–066057, from *http://www1.ipdl.jpo.go.jp*, 1 page (May 19, 1980—Date of publication of application).

English–language Abstract of Japanese Patent Publication No. 63–065587, from *http://www1.ipdl.jpo.go.jp*, 1 page (Mar. 24, 1988—Date of publication of application).

English–language Abstract of Japanese Patent Publication No. 63–153691, from *http://www1.ipdl.jpo.go.jp*, 1 page (Jun. 27, 1988—Date of publication of application).

Akos, D.M. et al., "Direct Bandpass Sampling of Multiple Distinct RF Signals," *IEEE Transactions on Communications*, IEEE, vol. 47, No. 7, pp. 983–988 (Jul. 1999).

Patel, M. et al., "Bandpass Sampling for Software Radio Receivers, and the Effect of Oversampling on Aperture Jitter," *VTC 2002*, IEEE, pp. 1901–1905 (2002).

English–language Abstract of Japanese Patent Publication No. 61–030821, 1 page (Feb. 13, 1986—Date of publication of application).

English–language Abstract of Japanese Patent Publication No. 05–327356, 1 page (Dec. 10, 1993—Date of publication of application).

Tayloe, D., "A Low–noise, High–performance Zero IF Quadrature Detector/Preamplifier," *RF Design*, pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117–120 (Apr. 1996).

Simoni, A. et al., "A Digital Camera for Machine Vision," *20th International Conference on Industrial Electronics, Control and Instrumentation*, IEEE, pp. 879–883 (Sep. 1994).

Stewart, R.W. and Pfann, E., "Oversampling and sigma–delta strategies for data conversion," *Electronics & Communication Engineering Journal*, IEEE, pp. 37–47 (Feb. 1998).

Rudell, J.C. et al., "A 1.9–Ghz Wide–Band IF Double Conversion CMOS Receiver for Cordless Telephone Applications," *IEEE Journal of Solid–State Circuits*, IEEE, vol. 32, No. 12, pp. 2071–2088 (Dec. 1997).

\* cited by examiner

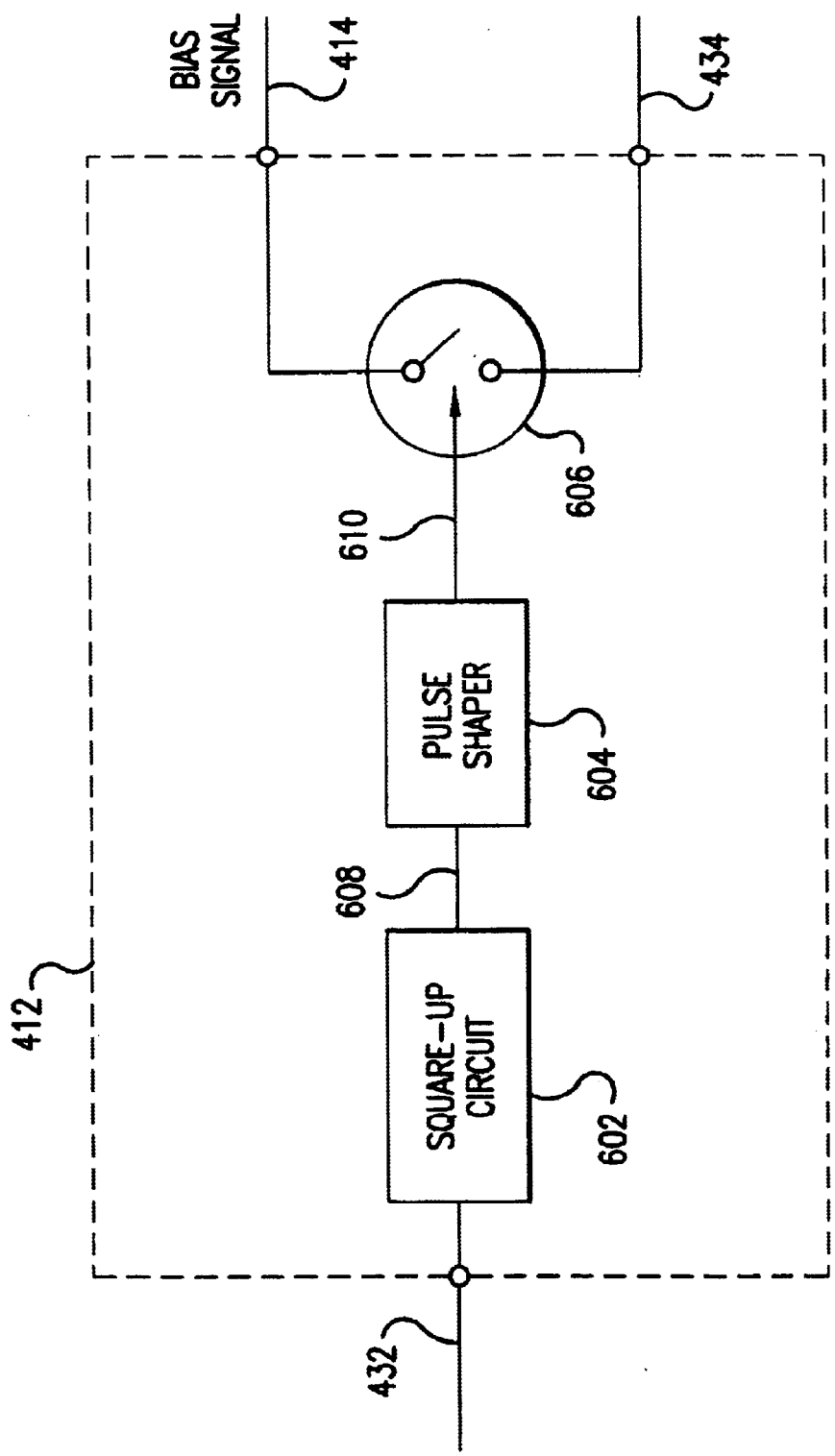

PHASE SHIFT
(RELATIVE TO $F_{D1}$ AT NODE 712)

| NODE | $F_{D1}$ | $F_{I1}$ | $F_{D2}$ | $F_{I2}$ |
|------|------|------|------|------|
| 712 | 0° | 0° | – | – |
| 723 | – | – | 0° | 0° |
| 716 | 0° | 0° | – | – |
| 725 | – | – | –90° | +90° |
| 720 | –90° | –90° | – | – |
| 737 | – | – | –90° | +90° |

IMAGE-REJECT DOWN-CONVERTER AND EMBODIMENTS THEREOF, SUCH AS THE FAMILY RADIO SERVICE

CROSS-REFERENCE TO OTHER APPLICATIONS

This application claims the benefit of U.S. Provisional Application No. 60/116,850, filed Jan. 22, 1999, which is herein incorporated by reference in its entirety.

The following applications of common assignee are related to the present application, and are herein incorporated by reference in their entireties:

"Method and System for Down-Converting Electromagnetic Signals," Ser. No. 09/176,022, filed on Oct. 21, 1998.

"Method and System for Frequency Up-Conversion," Ser. No. 09/176,154, filed on Oct. 21, 1998.

"Method and System for Ensuring Reception of a Communications Signal," Ser. No. 09/176,415, filed on Oct. 21, 1998.

"Integrated Frequency Translation and Selectivity," Ser. No. 09/175,966, filed on Oct. 21, 1998.

"Analog Zero IF FM Decoder and Embodiments Thereof, Such as the Family Radio Service," Ser. No. 09/476,093, filed Jan. 3, 2000.

"Communication System With Multi-Mode and Multi-Band Functionality and Embodiments Thereof, Such as the Family Radio Service," Ser. No. 09/476,093, filed Jan. 3, 2000.

"Multi-Mode, Multi-Band Communication System," Ser. No. 09/476,330, filed Jan. 3, 2000.

BACKGROUND OF THE INVENTION

1. Field of the Invention

The present invention is generally directed toward receiver-transmitter systems referred to as Family Radio Service (FRS) units, although the invention is not limited to this embodiment. The Family Radio Service is one of the Citizens Band Radio Services. It is intended for the use of family, friends, and associates to communicate among themselves within a neighborhood or while on group outings. There are fourteen discreet FRS channels available for use on a "take turns" basis. The FRS unit channel frequencies are:

| Channel No. | (MHz) |
|---|---|
| 1 | 462.5625 |
| 2 | 462.5875 |
| 3 | 462.6125 |
| 4 | 462.6375 |
| 5 | 462.6625 |
| 6 | 462.6875 |
| 7 | 462.7125 |
| 8 | 467.5625 |
| 9 | 467.5875 |
| 10 | 467.6125 |
| 11 | 467.6375 |
| 12 | 467.6625 |
| 13 | 467.6875 |
| 14 | 467.7125 |

Other selected technical specifications are:
(a) Frequency modulation (although phase modulation is allowed);
(b) Frequency tolerance of each FRS unit must be maintained within 0.00025%;
(c) The authorized bandwidth for an FRS unit is 12.5 kHz; and
(d) Effective radiated power (ERP) shall not, under any condition of modulation, exceed 0.500 W.

The operating rules for the FRS are found at 47 C.F.R. 95.191–95.194. For additional technical information, see 47 C.F.R. 95.601–95.669.

2. Related Art

Modern day communication systems employ components such as transmitters and receivers to transmit information from a source to a destination. To accomplish this transmission, information is imparted on a carrier signal and the carrier signal is then transmitted. Typically, the carrier signal is at a frequency higher than the baseband frequency of the information signal. Typical ways that the information is imparted on the carrier signal are called modulation.

SUMMARY OF THE INVENTION

The present invention is directed to a communications system with an image-reject down-converter. The invention has a number of aspects, including a ultra-low power down-converter, an image-reject down-converter, and a high-efficiency transmitter. In an embodiment, the present invention is used in a family radio system. It is to be understood, however, that the invention is not limited to this particular embodiment. Other implementations in communications-related environments are within the scope and spirit of the invention.

The present invention has a number of advantages, including power reduction, tuning reduction, parts reduction, price reduction, size reduction, performance increase, greater efficiency, and increased integration possibilities.

BRIEF DESCRIPTION OF THE FIGURES

FIG. 5b illustrates an exemplary frequency domain plot corresponding to the mixed circuit of FIG. 5a;

FIG. 6 illustrates an exemplary block diagram of the universal frequency translator module being used in the transmitter embodiment of the present invention;

FIG. 7b illustrates a frequency domain plot of waveforms associated with the exemplary block diagram of FIG. 7a;

FIG. 7c illustrates a phase relationship table for waveforms associated with the exemplary block diagram of FIG. 7a;

FIGS. 10a through 10d illustrate a detailed schematic drawing of the exemplary block diagram of FIG. 7a.

DETAILED DESCRIPTION OF THE PREFERRED EMBODIMENTS

The following sections describe methods related to an ultra-low power down-converter, an image-reject down-converter, and a high-efficiency transmitter. Structural exemplary embodiments for achieving these methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

Ultra-Low Power Down-Converter

The present invention can be implemented with an aliasing system as disclosed in U.S. patent application Ser. No. 09/176,022, titled,"Method and System for Down-Converting Electromagnetic Signals," incorporated herein by reference in its entirety.

Figure 1:
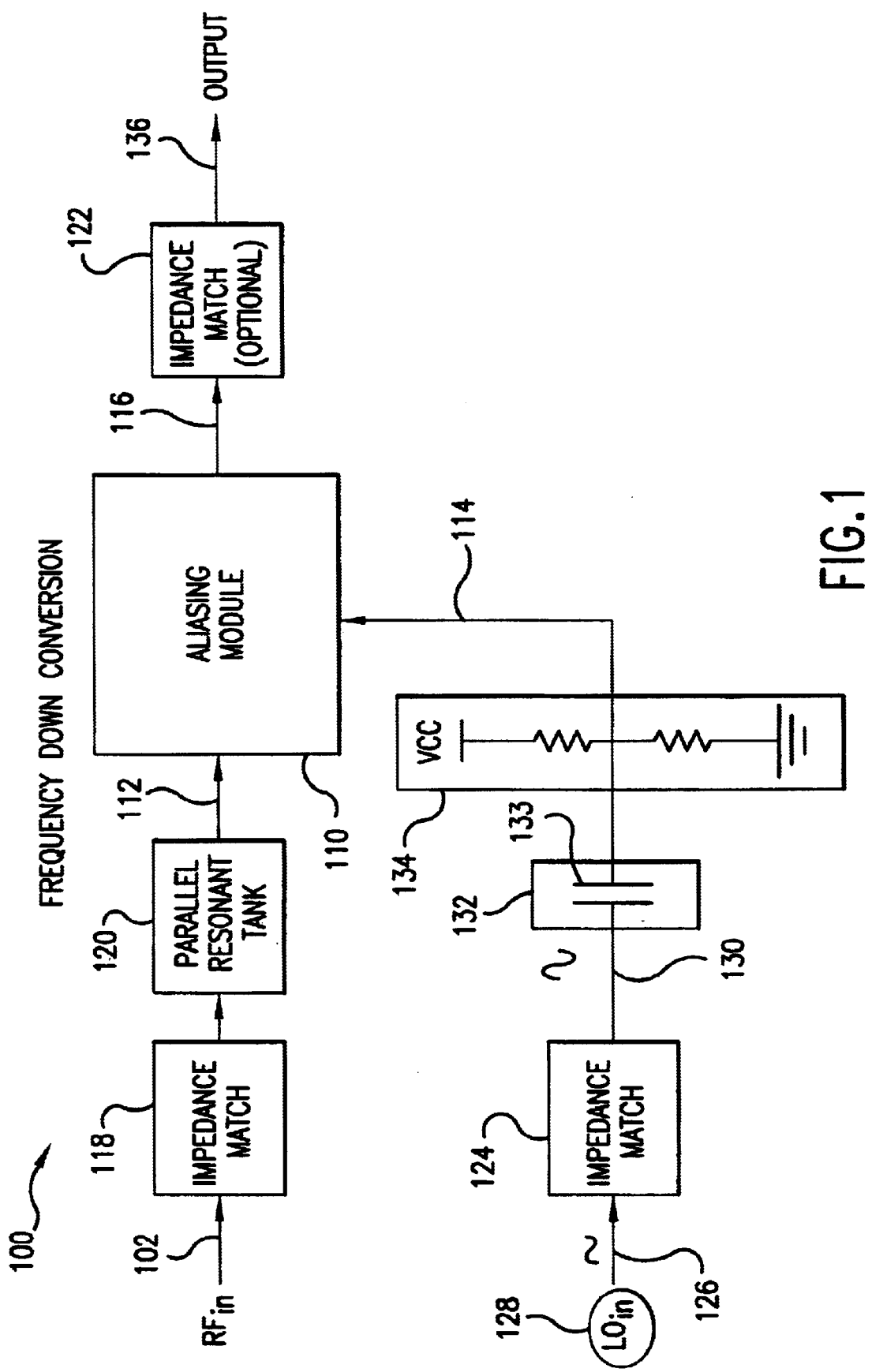
FIG. 1 illustrates an exemplary block diagram of the ultra-low power down-converter system.

FIG. 1 illustrates an exemplary aliasing system 100 for down-converting electromagnetic (EM) signals, such as an RF input ($RF_{in}$) signal 102. The aliasing system 100 is an exemplary embodiment of an optimized aliasing system, referred to herein as an ultra low power down-converter.

The exemplary aliasing system 100 includes an aliasing module 110 that aliases an EM signal 112, using an aliasing signal 114, and outputs a down-converted signal 116, as disclosed in U.S. patent application Ser. No. 09/176,022, titled,"Method and System for Down-Converting Electromagnetic Signals," incorporated herein by reference in its entirety. The aliasing module 110 is also referred to herein as a universal frequency translator (UFT) module.

Aliasing system 100 optionally includes one or more of an input impedance match module 118, a parallel resonant tank module 120, and an output impedance match module 122, as disclosed in the '022 application.

Aliasing system 100 optionally includes a local oscillator (LO) impedance match module 124 for impedance matching a local oscillator input ($LO_{in}$) signal 126, generated by a local oscillator 128, to the aliasing module 110. The LO impedance match module 124 can be designed to increase the voltage of the $LO_{in}$ signal 126, as illustrated by a higher voltage $LO_{in}$ signal 130. The LO impedance match module 124 permits the aliasing system 100 to efficiently operate with a relatively low voltage $LO_{in}$ signal 126, without the use of power consuming amplifiers that would otherwise be necessary to increase the amplitude of the $LO_{in}$ signal 126.

Unless otherwise noted, the aliasing signal 114 is used interchangeably herein to refer to the $LO_{in}$ signal 126 and/or the higher voltage $LO_{in}$ signal 130.

The aliasing system 100 optionally includes a DC block 132 that substantially blocks DC while passing substantially all non-DC. In the exemplary embodiment, the DC block 132 is a capacitor 133. A variety of implementations of the DC block 132 suitable for the present invention are available as will be apparent to persons skilled in the relevant art, based on the teachings herein.

The aliasing system 100 optionally includes a bias module 134 for biasing the aliasing signal 114. A variety of implementations of the biasing module 134 suitable for the present invention are available as will be apparent to persons skilled in the relevant art, based on the teachings herein.

Figure 2:
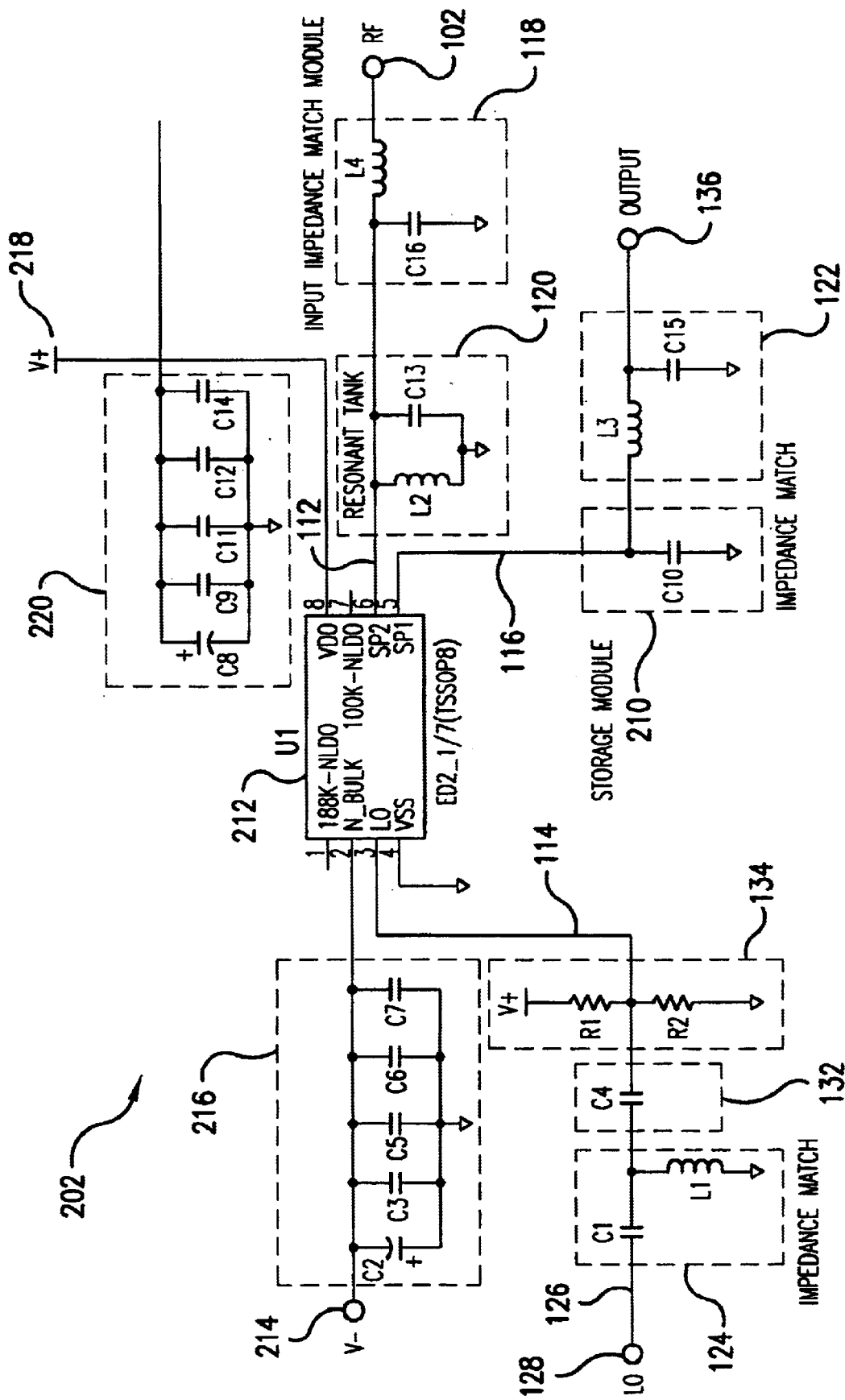
FIG. 2 illustrates a detailed schematic drawing of the exemplary block diagram of FIG. 1.

FIG. 2 illustrates an exemplary schematic diagram 202 that can be used to implement the aliasing system 100. The exemplary schematic diagram 202 provides exemplary circuit elements that can be used within the optional input impedance match module 118, the optional parallel resonant tank 120, the optional output impedance match module 122, the optional LO impedance match module, the optional DC block 132, and the optional bias module 134. The invention is not limited to the exemplary embodiment of FIG. 2.

The exemplary schematic diagram 202 includes a storage module 210 for storing energy transferred from the EM signal 112, as disclosed in the '022 application.

In the schematic diagram 202, the aliasing module 110 of FIG. 1 is illustrated as an application specific integrated circuit (ASIC) 212. In an embodiment, the ASIC is implemented in complementary metal oxide semiconductor (CMOS).

The ASIC 212 is coupled to a first voltage source 218 for supplying power circuits within the ASIC 212. The circuits within the ASIC 212 are described below with reference to FIG. 3. An optional first bypass module 220 is optionally disposed as illustrated to substantially eliminate unwanted frequencies from the first power supply 218 and from the ASIC 212.

The ASIC 212 includes a substrate (not shown) which is optionally coupled to a second voltage source 214. An advantage of coupling the substrate to the second voltage source 214 is described below with reference to FIG. 3. When the substrate is coupled to the second voltage source 214, an optional second bypass module 216 is optionally disposed as illustrated to substantially eliminate unwanted frequencies from the substrate and the second voltage source 214.

Figure 3:
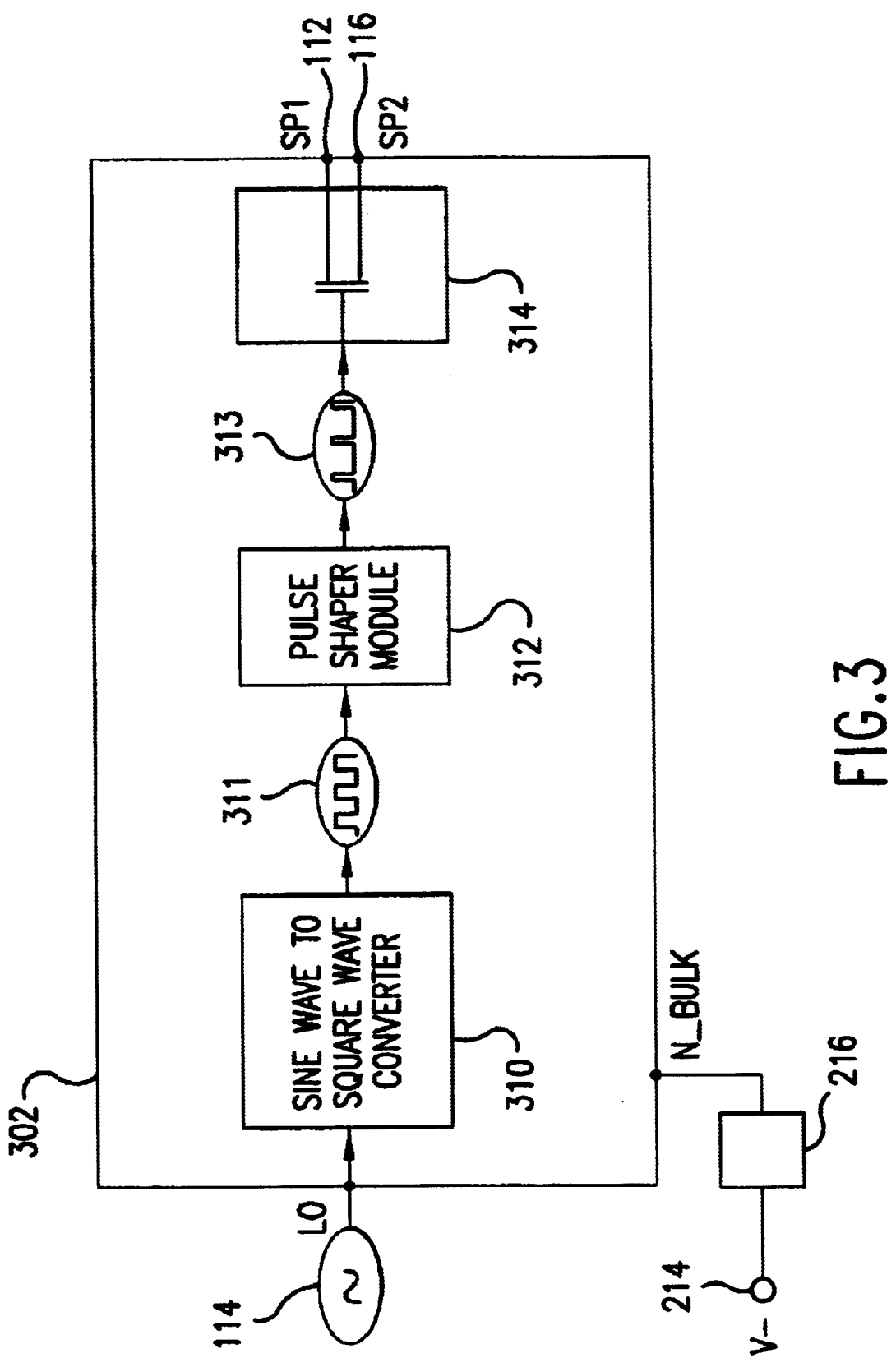
FIG. 3 illustrates an exemplary block diagram of the universal frequency translator module being used in the ultra-low power down-converter embodiment of the present invention.

FIG. 3 illustrates an aliasing module 302, which is an exemplary embodiment of the aliasing module 110 and the ASIC 212. The aliasing module 302 includes a sine wave to square wave converter module 310, a pulse shaper module 312 and a switch module 314. The sine wave to square wave converter module 310 converts a sine wave 114 from the local oscillator 128 to a square wave 311. The pulse shaper module 312 receives the square wave 311 and generates energy transfer pulses 313 therefrom. Energy transfer pulses are discussed in greater detail in the '022 application.

In an embodiment, the pulse shaper module 312 is implemented as a mono-stable multi-state vibrator. A variety of implementations of the pulse shaper module 312 suitable for the present invention are available as will be apparent to persons skilled in the relevant art, based on the teachings herein.

Generally, the frequency of the energy transfer pulses 311 is determined by the frequency of the aliasing signal 114 and the width or aperture of the energy transfer pulses is determined by the pulse shaper module 312.

In the illustrated embodiment, where the sine wave to square wave converter module 310 and the pulse shaper module 312 are provided on-chip, the ASIC substrate (not shown) is optionally coupled to the second power supply 214. The second power supply 214 can be varied to affect the performance of the circuits on the ASIC 212, with a result of effectively adjusting the pulse width of the energy transfer pulses 313.

In an alternative embodiment, the sine wave to square wave converter module 310 and/or the pulse shaper module 312 are provided off-chip.

An advantage of the ultra-low power down-converter aliasing system 100 is its low power consumption. For example, in an actual implementation, the aliasing module 302 required an average of approximately 1 mA and consumed approximately 3 to 5 mWatt. This is significantly greater performance than conventional down converter systems.

Other advantages of the ultra-low power down-converter aliasing system 100 include tuning reduction, parts reduction, price reduction, size reduction, performance increase, low frequency and power LO, and excellent linearity. Another advantage of the ultra-low power down-converter aliasing system is that it can down-convert EM signals as high as 3.5 GHZ when implemented in CMOS. Higher frequencies can be down-converted using other materials such as gallium arsenide (GaAs), for example.

In an embodiment, an ultra-low power down-converter as described above is implemented in an FRS.

Image-Reject Down-Converter

The present invention is directed toward an image reject mixer using a universal frequency translation (UFT) module. The image reject mixer down-converts an input signal to an intermediate frequency signal, but rejects or attenuates the associated image frequency signal. As compared with conventional mixers, the present invention down-converts an input signal to a lower frequency with lower front-end attention, lower component count, lower cost, and lower overall power requirements when compared with conventional frequency mixers.

Figure 5A:
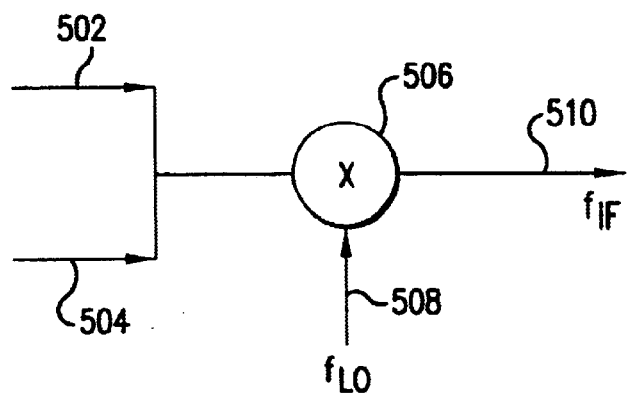
FIG. 5a illustrates an exemplary mixer circuit.
Figure 5B:
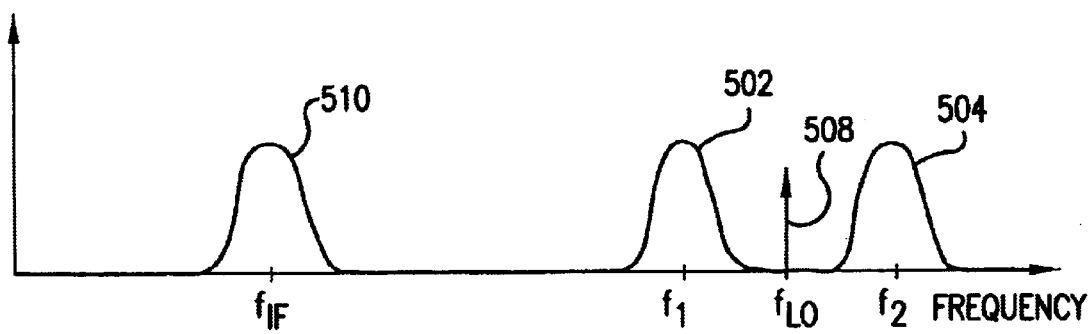

Referring to FIGS. 5A–5B, a conventional mixer 506 generates an intermediate frequency (IF) signal 510 at frequency ($f_{IF}$) using a local oscillator (LO) signal 508 at frequency $f_{LO}$ and at least one input signal. For a given LO frequency ($f_{LO}$) and IF frequency ($f_{IF}$), IF signal 510 contains a down-converted representation of input signals located at frequencies $f_1=f_{LO}+f_{IF}$, and $f_2=f_{LO}-f_{IF}$. FIGS. 5A–5B, illustrate input signal 502 at frequency ($f_1$) and input signal 504 at frequency ($f_2$) being down-converted to IF signal 510 at $f_{IF}$. For example, if $f_1$ is 901 MHZ, $f_2$ is 899 MHZ, and $f_{LO}$ is 900 MHZ, then both the input signal 502 and input signal 504 are down-converted to the desired $f_{IF}$ of 1 MHz.

Typically, it is desired that the IF signal 510 contain a down-converted representation of only one of the first or second input signals. Herein, the input signal that is desired to be down-converted is called the desired input signal, and the other input signal is called the undesired input signal. Alternatively, it is desired that the representation of the undesired signal in the IF signal be significantly attenuated compared with the desired signal. For example, if input signals 502, 504 represent independent voice messages, then the simultaneous down-conversion of both input signals 502, 504 to $f_{IF}$ using a conventional mixer may result in neither message being clearly recovered.

The undesired input signal and it's down-converted representation are often referred to as an image signal. For example, referring to FIG. 5B, if it is desired that only the input signal 502 be represented by the IF signal 510, then the input signal 504 may be referred to as the image signal of the desired input signal 502. Furthermore, $f_2$ is referred to as the "image frequency", even when no signal is currently present at this frequency. This illustration is for example only, the input signal 504 could be chosen as the desired input signal. In which case, input signal 502 would be the image signal and $f_1$ would be the image frequency, as will be understood by those skilled in the arts based on the discussion herein.

Figure 7A:
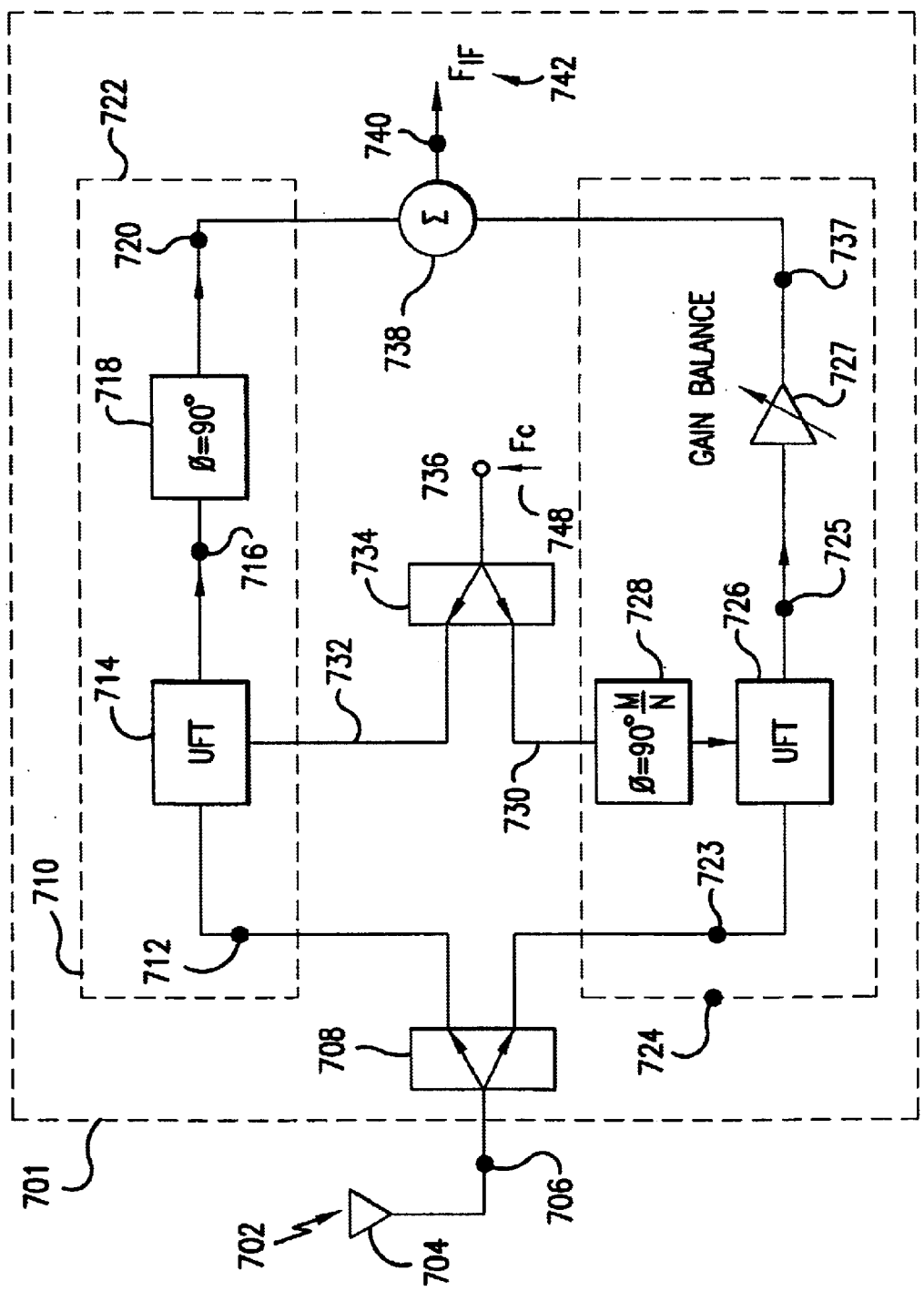
FIG. 7a illustrates an exemplary block diagram of the image-reject down-converter embodiment of the present invention.

FIG. 7A illustrates a block diagram of an image rejection mixer 701 according to the present invention. Image rejection mixer 701 down-converts a desired input signal but significantly attenuates the down-conversion of the image input signal. FIG. 7A illustrates an antenna 704 and a the image reject mixer 701. Image rejection mixer 701 comprises: input signal splitter 708, path 710, path 724, and summer 738. Path 710 comprises: UFT module 714, and phase shifter 718. Path 724 comprises: phase shifter 728, UFT module 726, and gain balance module 727.

Figure 7B:
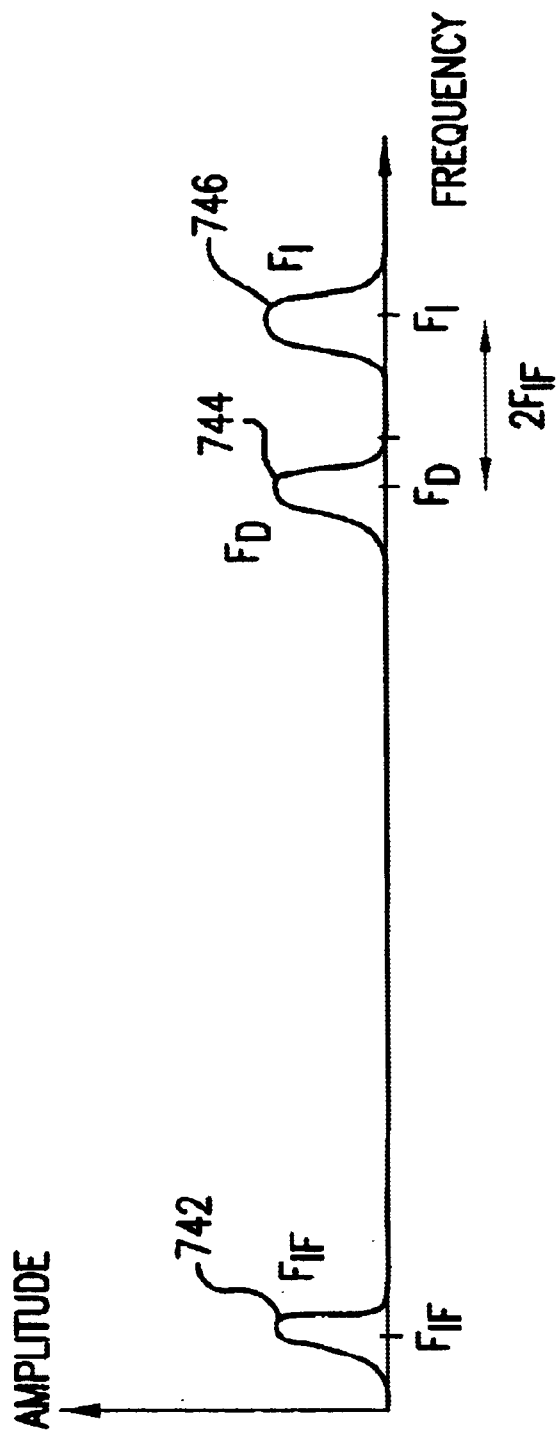

Antenna 704 receives an input signal 702. Input signal 702 may contain a desired input signal $F_D$ and an image signal $F_I$, as illustrated by $F_D$ 744 and $F_I$ 746 in FIG. 7B. Preferably, $F_D$ and $F_I$ are separated by $2f_{IF}$, where $f_{IF}$ is the frequency of the IF signal 742 generated by image reject mixer 701.

The operation of image reject mixer 701 is as follows. Splitter 708 receives input signal 702 from antenna 704. Splitter 708 splits the input signal 702 into two signals that are routed to two paths, path 710 and path 724. Preferably, the splitter output signals are approximately equal amplitude and equal phase to each other. A variety of equal-amplitude and equal-phase power splitters are readily available as will be understood by those skilled in the relevant arts. As stated above, input signal 702 contains a desired signal $F_D$ and image signal $F_I$. Therefore, splitter 708 generates a desired signal $F_{D1}$ and a image signal $F_{I1}$ that exist at node 712, and a desired signal $F_{D2}$ and image signal $F_{I2}$ that exist at node 723.

Splitter 734 receives a control signal $F_C$ 748. FC is preferably a sinewave with frequency $f_C=(f_D+f_I)/(2 \cdot N)$, where N is an integer (1,2,3 . . . ). Splitter 734 generates control signals $F_{C1}$ and $F_{C2}$ at nodes 732 and 730, respectively. Splitter 734 is preferably equal amplitude and equal phase splitter; a variety of which are available as will be apparent to those skilled in the arts based on the discussion herein. $F_{C1}$ will be used by UFT module 714 to down-convert $F_{D1}$ and $F_{I1}$, and $F_{C2}$ will be used by UFT module 726 to down-convert $F_{D2}$ and $F_{I2}$ as will be described below. The down-conversion by UFT modules 714,726 is fully described in pending U.S. patent application Ser. No. 09/176,022, titled,"Method and System for Down-Converting Electromagnetic Signals."

The operation of path 710 will now be described in detail, after which path 724 will be described. Finally, summer 738 will be described.

As illustrated in FIG. 7A, path 710 contains UFT module 714 and phase shifter 718. UFT module 714 accepts desired signal $F_{D1}$, image signal $F_{I1}$, and control signal $F_{C1}$. UFT module 714 down-converts the $F_{D1}$ and $F_{I1}$ to the lower intermediate frequency ($f_{IF}$). The down-conversion of an input signal to an IF signal is fully described in pending U.S. patent application Ser. No. 09/176,022, titled, "Method and System for Down-Converting Electromagnetic Signals," which is incorporated by reference in its entirety. As such, $F_{D1}$ and $F_{I1}$ are down-converted to a lower frequency, $f_{IF}$.

A summary of the above mentioned U.S. patent application Ser. No. 09/176,022 follows. In an embodiment, the universal frequency translator (UFT) down-converts an input signal. The UFT may down-convert the input signal to an IF signal, or to a demodulated baseband signal. In particular, the rate of a control signal determines whether the input signal is down-converted to an IF signal, or down-converted to a demodulated baseband signal. Other down-conversion options are also possible using the UFT 118. Generally, relationships between the input signal, the rate of the control signal, and the down-converted output signal are illustrated below:

(Freq. of input signal)=$N$·(Freq. of control signal)±(Freq. of down-converted output signal)

For the examples contained herein, for illustrative purposes only and without limitation, only the "+" condition will be discussed. The value of N represents a sub-harmonic or harmonic of the input signal (e.g., N=0.5, 1, 2, 3, ...).

The UFT is further described in U.S. patent applications "Method and System for Down-Converting Electromagnetic Signals," Ser. No. 09/176,022, filed Oct. 21, 1998, "Analog Zero IF FM Decoder and Embodiments Thereof, Such as the Family Radio Service," Ser. No. 09/476,092, "Communication System With Multi-Mode and Multi-Band Functionality and Embodiments Thereof, Such as the Family Radio Service," Ser. No. 09/476,093, and "Multi-Mode, Multi-Band Communication System," Ser. No. 09/476,330, which are incorporated herein by reference in their entireties.

The operation of path 710 will now be described in detail, after which path 724 will be described. Finally, summer 738 will be described.

Phase shifter 718 receives the down-converted signals $F_{D1}$ and $F_{I1}$, and phase shifts $F_{D1}$ and $F_{I1}$ by approximately 90 degrees. A variety of 90 degree phase shifters are readily available as will be apparent to those skilled the relevant arts.

Path 724 will now be described. As discussed above, Path 724 comprises UFT module 726, phase shifter 728, and gain balance module 727. Phase shifter 728 accepts control signal $F_{C2}$ from splitter 734. As discussed above, $F_C$ preferably comprises a sinewave with frequency $f_C=(f_D+f_I)/(2\cdot N)$, where N is an integer. For a selected value of N, phase shifter 728 shifts the phase of control signal $F_{C2}$ by an amount of 90·M/N degrees, where M is an odd integer (M=1, 3, 5 ...).

UFT module 726 accepts desired signal $F_{D2}$, image signal $F_{I2}$, and phase shifted control signal $F_{C2}$. UFT module 726 down-converts the $F_{D2}$ and $F_{I2}$ to the lower intermediate frequency ($f_{IF}$) using the phase shifted control signal from phase shifter 728. The down-conversion of an input signal to an IF signal is fully described in pending U.S. patent application Ser. No. 09/176,022, titled, "Method and System for Down-Converting Electromagnetic Signals", which is incorporated by reference in its entirety. As such, $F_{D2}$ and $F_{I2}$ are down-converted to a lower frequency, $f_{IF}$.

Gain Balance module 727 accepts the down-converted signals $F_{D2}$ and $F_{I2}$ and adjusts the power level of $F_{D2}$ and $F_{I2}$ such that the power of $F_{D2}$ and $F_{I2}$ at node 737 is approximately equal to that of $F_{D1}$ and $F_{I1}$ at node 720. This improves the cancellation of $F_{I1}$ and $F_{I2}$ by summer 738. In one embodiment, gain balance module is an attenuator with an attenuation that is similar to the attenuation caused by phase shifter 718. In an alternate embodiment, gain balance module 727 is an inverter amplifier that can be used change the selected signal that adds in-phase at summer 738.

The operation of summer 738 will now be described. Summer 738 receives down-converted signals $F_{D1}$ and $F_{I1}$ from path 710, and down-converted signals $F_{D2}$ and $F_{I2}$ from path 724. Summer 738 sums these four signal to generate $F_{IF}$ 742. Because of the relative phase relationship of the four signals, $F_{D1}$ and $F_{D2}$ substantially add in-phase, and $F_{I1}$ and $F_{I2}$ substantially cancel. Therefore, $F_{IF}$ 742 substantially comprises the desired signal $F_D$, and the undesired image signal $F_I$ is substantially attenuated when compared with that of $F_D$.

The relative phase relationships between $F_{D1}$, $F_{D2}$, $F_{I1}$, $F_{I2}$ will now be described using FIG. 7C. FIG. 7C lists the phase relationship for the above mentioned signals at various nodes in image reject mixer 701 relative to the phase of $F_{D1}$ at node 712. This is done for illustrative purposes only, as any phase reference could be chosen.

At node 712, $F_{D1}$ and $F_{I1}$ are shifted by 0 degrees. Likewise at node 723, $F_{D2}$ and $F_{I2}$ are phase shifted by 0 degrees. This occurs because splitter 708 is preferably an equal phase splitter that causes negligible phase shift.

At node 716, down-converted $F_{D1}$ and down-converted $F_{I1}$ are phase shifted by 0 degrees. At node 725, down-converted $F_{D2}$ and down-converted $F_{I2}$ are phase shifted by −90 degrees, and +90 degrees, respectively. This occurs because the control signal $F_{C2}$ is phase shifted by the amount of (90·M/N), where N is associated with the control signal $F_C$ as described above. This phase shifted control signal operates UFT module 726, which down-converts $F_{D2}$ and $F_{I2}$ and implements the described phase shift.

At node 720, down-converted $F_{D1}$ and down-converted $F_{I1}$ are phase shifted by −90 degrees, and −90 degrees respectively by phase shifter 718.

At node 737, down-converted $F_{D2}$ and down-converted $F_{I2}$ maintain the phase relationship of −90 degrees and +90 degrees.

The reason for the cancellation of down-converted $F_{D1}$ and down-converted $F_{I2}$ in summer 738 can now be seen. At node 720, down-converted $F_{I1}$ has a relative phase shift of −90 degrees. In contrast, down-converted $F_{I2}$ at node 737 has a relative phase shift of +90 degrees. Therefore, when down-converted $F_{I1}$ and down-converted $F_{I2}$ are combined in summer 738 there is signal cancellation because down-converted $F_{I1}$ and down-converted $F_{I2}$ are 180 degrees out of phase.

In contrast, summer 738 combines down-converted $F_{D1}$ and down-converted $F_{D2}$ in an additive manner because down-converted $F_{D1}$ at node 720 and down-converted $F_{D2}$ at node 737 have approximately the same relative phase shift of −90 degrees. Therefore, $F_{IF}$ 742 substantially contains the down-converted representation of the desired signal $F_D$, only. The level of signal rejection of the image signal $F_I$ is theoretically infinite and only limited by component mismatches.

FIGS. 10A–10D illustrate a detailed schematic diagram that further describes one embodiment of image rejection mixer 701. Splitter 1002 is one embodiment of splitter 708. UFTs 1002 and 1004 are one embodiment of UFT 714 and UFT 726, respectively. In one embodiment, UFT 1002 comprises a CMOS chip 1003, and UFT 1004 comprises a CMOS chip 1005. Signals 1014 and 1016 connect FIGS. 10A through 10D for illustration purposes. Signal 1020 comprises down-converted $F_{D1}$ and down-converted $F_{I1}$ at node 716 in FIG. 7A, and down-converted signal 1022 comprises down-converted $F_{D2}$ and down-converted $F_{I2}$ at node 725. In one embodiment, amplifier 1010 is included in path 710, and amplifier 1012 is included in path 724. Amplifiers 1010 and 1012 are optional to improve the signal strength and are not necessary to practice the present invention. In one embodiment, phase shifter 718 comprises phase shifter 1014. In one embodiment, gain balance module 727 comprises gain balance module 1016.

High-Efficiency Transmitter

This section describes the high-efficiency transmitter embodiment of a frequency up-converter for use in the family radio system. It describes methods and systems related to a transmitter. Structural exemplary embodiments for achieving these methods and systems are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The present invention has significant advantages over conventional transmitters. These advantages include, but are not limited to, a reduction in the number of parts to accomplish the transmitter function, a reduction in the power requirements for the circuit, and a reduction of cost and complexity by permitting the use of circuits designed for lower frequency applications, including, but not limited to, lower frequency oscillators.

Figure 4:
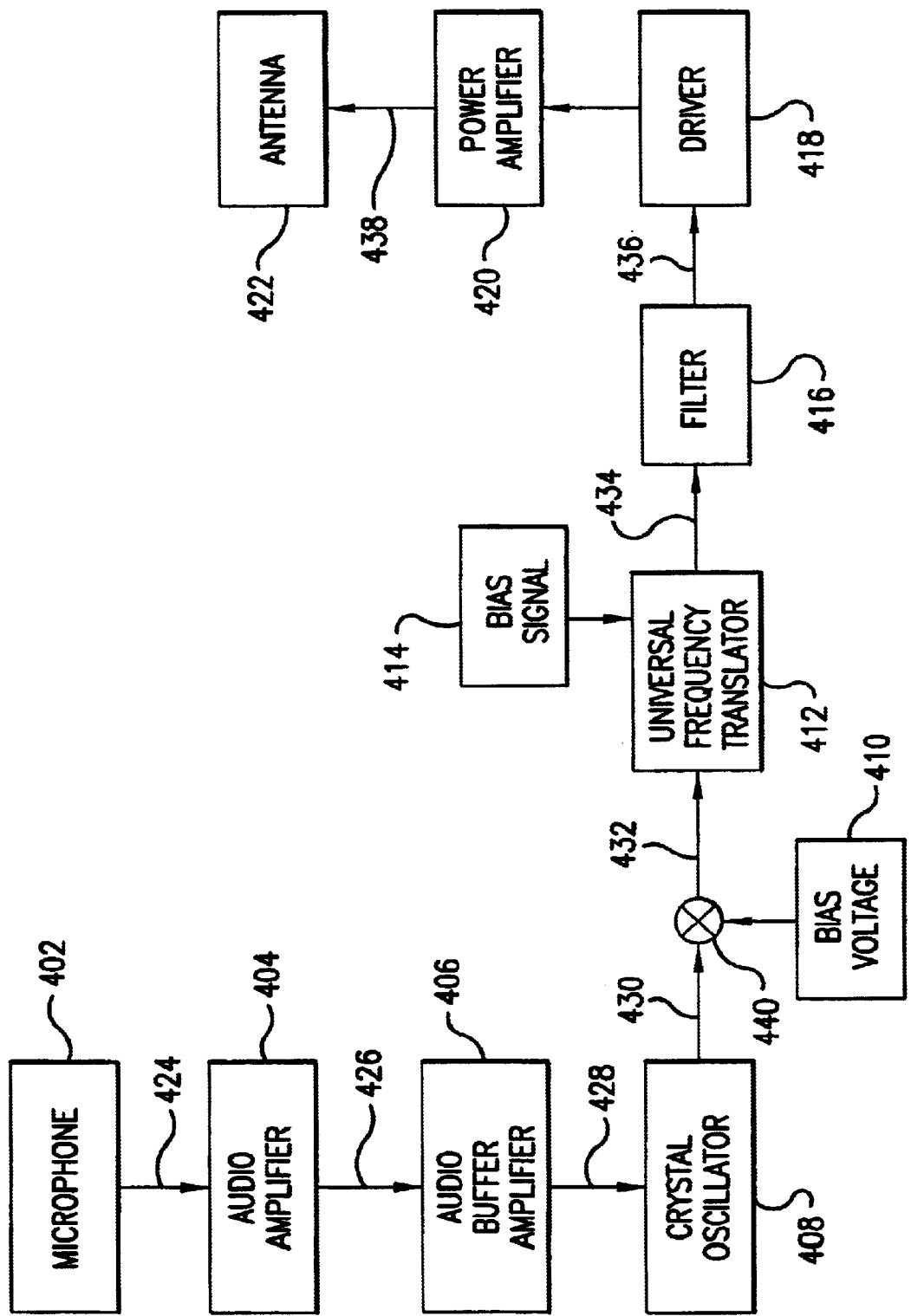
FIG. 4 illustrates an exemplary block diagram of the transmitter embodiment of the present invention.

An embodiment for transmitting a voice signal is shown in FIG. 4. The voice signal is input to a microphone 402. The output of microphone 402 is an analog voice signal 424 which is connected to an audio amplifier 404. The output of audio amplifier 404 is an amplified signal 426 which is filtered by an audio buffer amplifier 406. Audio buffer amplifier 406 acts as a low pass filter to eliminate unwanted higher frequency signals. The output of audio buffer amplifier 406 is a signal 428 which is accepted by crystal oscillator 408. Crystal oscillator 408 operates as a voltage controlled oscillator and outputs a frequency modulated (FM) signal 430 that is a sinusoidal signal biased substantially around zero volts.

At a node 440, a bias voltage 410 combines with FM signal 430. For the implementation wherein bias voltage 410 is a positive voltage, the bias point of FM signal 430 is raised such that substantially the entire waveform is above zero. In an alternate implementation wherein bias voltage 410 is negative, the bias point of FM signal 430 is lowered such that substantially all of the waveform is below zero. This combination of FM signal 430 and bias voltage 410 results in an FM control signal 432. Substantially all of FM control signal 432 is above zero (or below zero if bias voltage 410 is negative). FM control signal 432 is then input to a universal frequency translator (UFT) module 412.

UFT module 412 is comprised of a pulse shaping circuit and a switch, and is described in detail below in FIG. 6. The output of UFT module 412 is a rectangular waveform 434 that contains a plurality of harmonics. Rectangular waveform 434 is accepted by a filter 416 which filters out the undesired harmonic frequencies and outputs a desired output signal 436. Desired output signal 436 is the frequency modulated signal at the desired output frequency. Desired output signal 436 goes to a driver 418 and then to a power amplifier 420. The output of power amplifier 420 is an amplified output signal 430. Amplified output signal 430 is ready for transmission and is routed to an antenna 422.

The design of UFT module 412 is shown in FIG. 6. FM control signal 432 is accepted by a "square-up" circuit 602 to create a frequency modulated square wave 608 from the sinusoidal waveform of FM control signal 432. FM square wave 608 is then routed to a pulse shaper 604 to create a string of pulses 610. In one embodiment, pulse shaper 604 is a mono-stable multivibrator. The string of pulses 610 operates a switch 606 which creates rectangular waveform 434. Typically, pulse shaper 604 is designed such that each pulse in string of pulses 610 has a pulse width "τ" that is substantially equal to (n/2)·T, where "T" is the period of desired output signal 436, and "n" is any odd number. As stated previously, switch 606 outputs rectangular waveform 434, which is then routed to filter 416 of FIG. 4. Another input to UFT module 412 is bias signal 414, which, in this embodiment, is connected to the opposite terminal of switch 606 from rectangular waveform 434.

Figure 9:
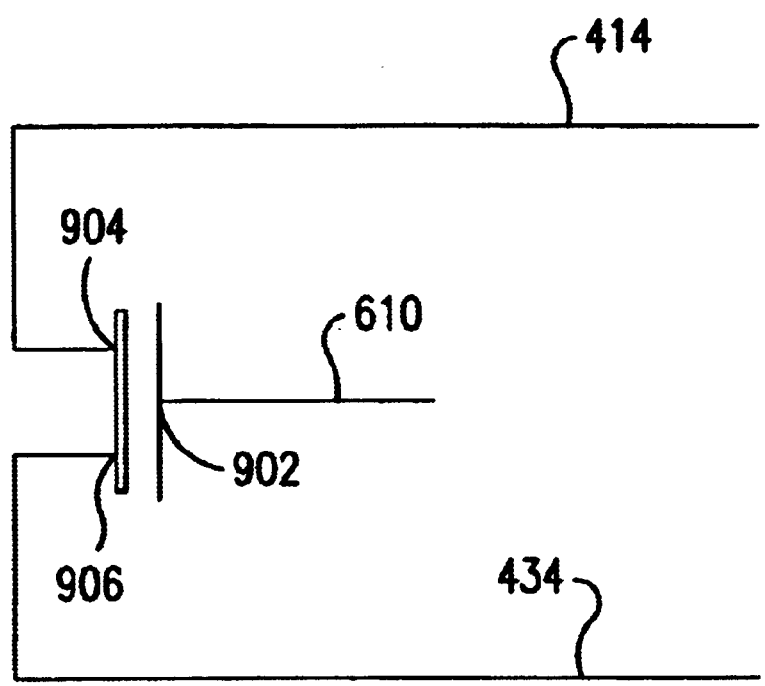
FIG. 9 illustrates an exemplary implementation of a switch in the universal frequency translator module of FIG. 6.
Figure 10A:
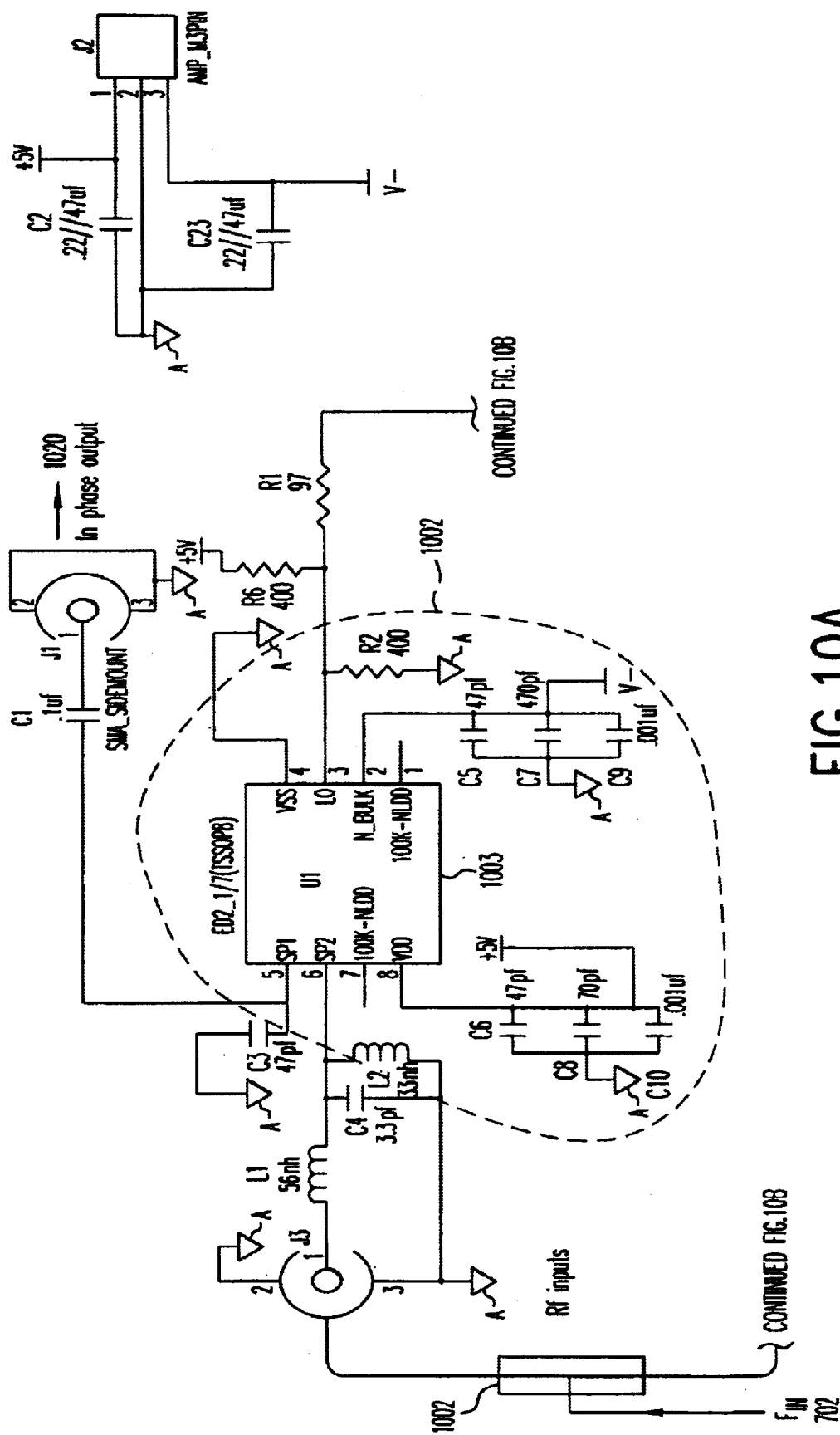
Figure 10B:
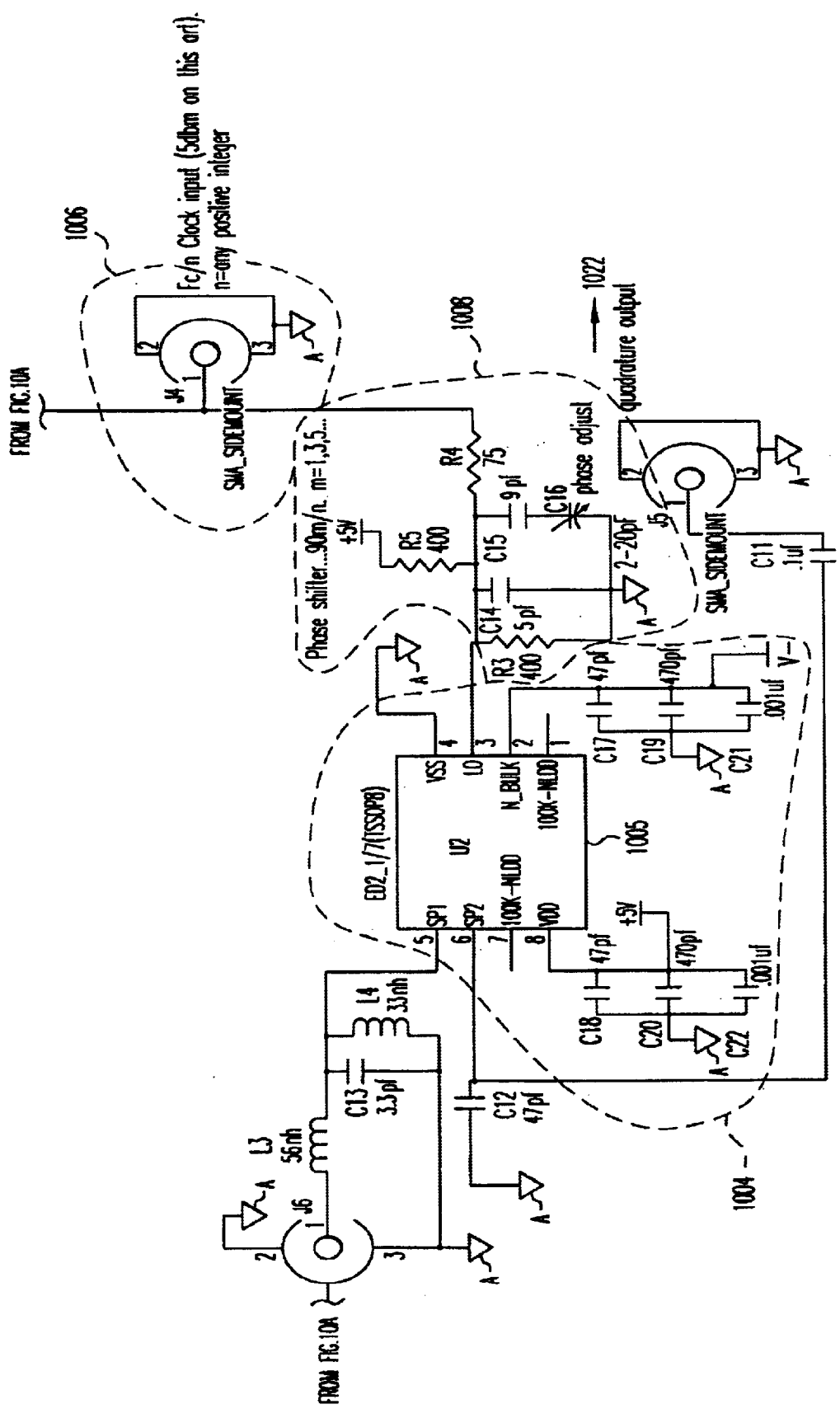
Figure 10C:
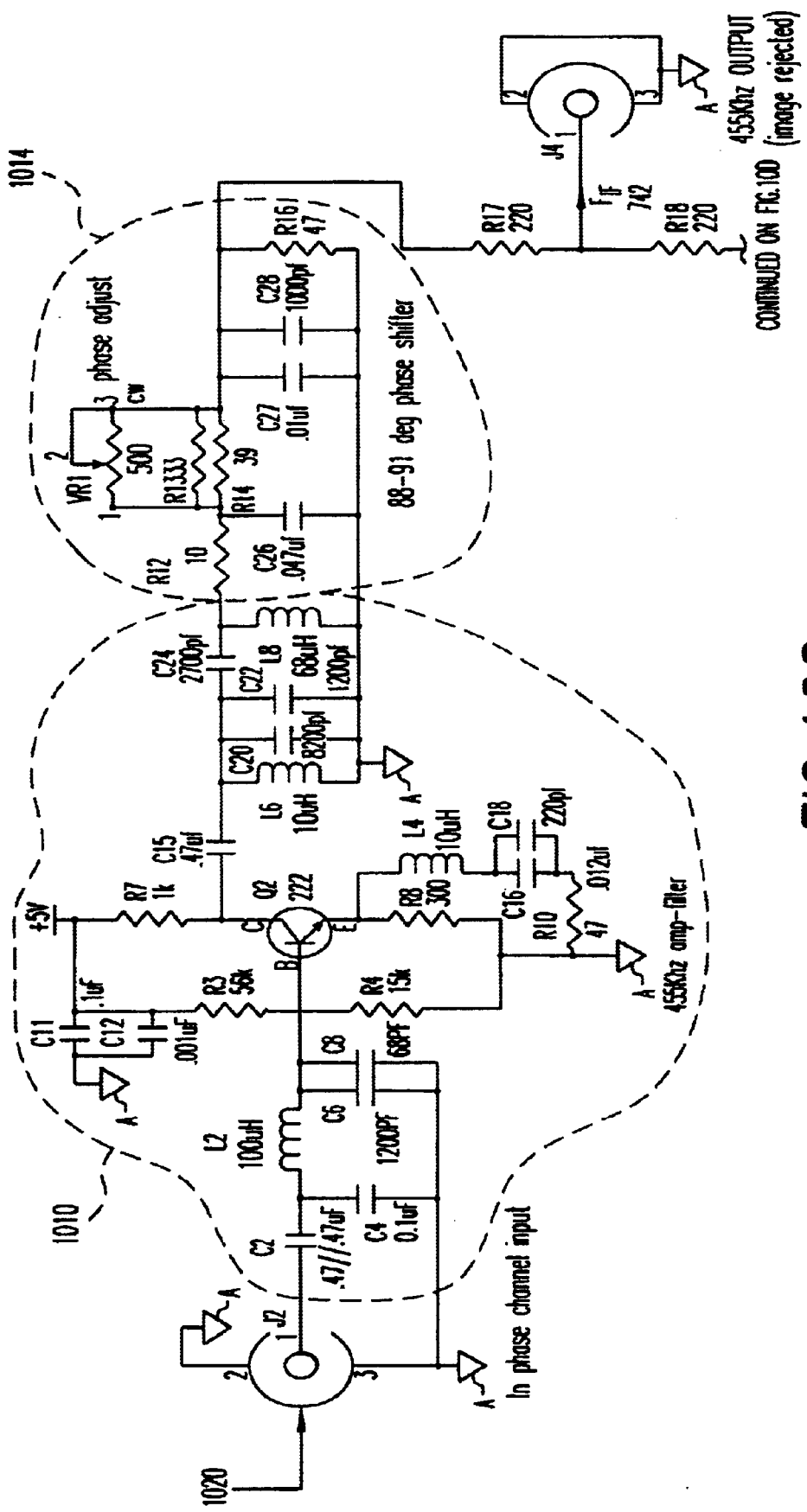
Figure 10D:
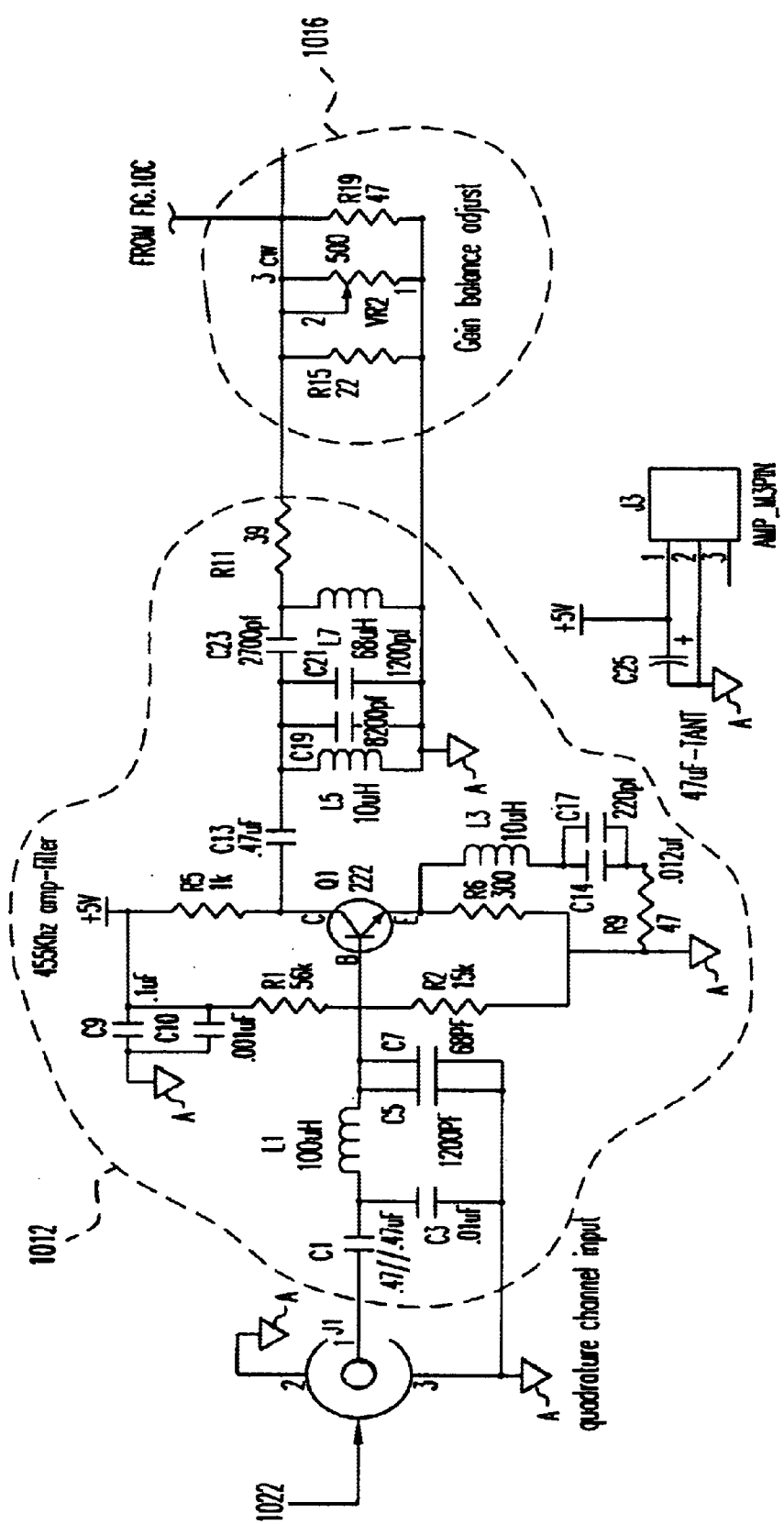

In one implementation of the invention, switch 606 is a field effect transistor (FET). A specific implementation wherein the FET is a complementary metal oxide semiconductor (CMOS) FET is shown is FIG. 9. A CMOS FET has three terminals: a gate 902, a source 904, and a drain 906. String of pulses 610 is shown at gate 902, bias signal 414 is shown at source 904, and rectangular waveform 434 is shown at drain 906. Those skilled in the relevant art(s) will appreciate that the source and drain of a FET are interchangeable, and that bias signal 414 could be at the drain 906, with rectangular waveform 434 being at the source 904. Numerous circuit designs are available to eliminate any possible asymmetry, and an example of such a circuit may be found in co-pending U.S. patent application entitled "Method and System for Frequency Up-Conversion," application No. 09/176,154, filed Oct. 21, 1998, the full disclosure of which is incorporated herein by reference.

Figure 8:
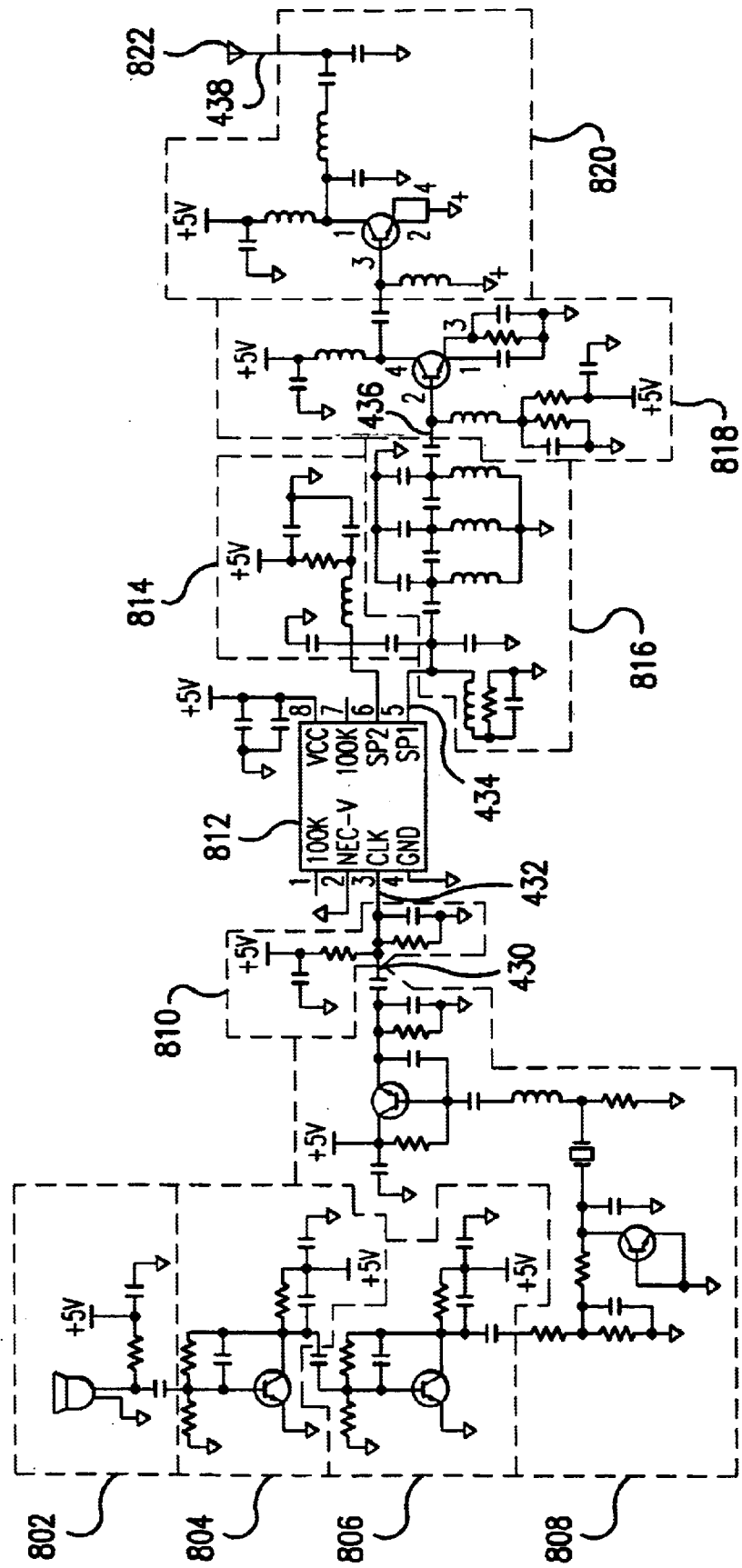
FIG. 8 illustrates a detailed schematic drawing of the exemplary block diagram of FIG. 4.

FIG. 8 is a detailed schematic drawing of the embodiment described above. Those skilled in the relevant art(s) will appreciated that numerous circuit designs can be used, and that FIG. 8 is shown for illustrative purposes only, and is not limiting. In addition, there are a variety of commercially available components and assemblies suitable for use in the present invention (e.g., audio amplifiers, audio buffer amplifiers, crystal oscillators, drivers, and power amplifiers) as will be apparent to those skilled in the relevant art(s) based on the teachings contained herein.

Microphone 402 of FIG. 4 is shown as a microphone 802. The output of microphone 802 is a voice signal which is routed to an audio amplifier 804 and then to an audio buffer amplifier 806. A crystal oscillator 808 is driven by the output of audio buffer amplifier 806 to create the FM signal 430. A bias voltage 810 combines with FM signal 430 to create the FM control signal 432. FM control signal 432 is routed to a UFT module 812 which creates rectangular signal 434. Also connected to UFT 812 is a bias signal 812. Rectangular signal 434 is filtered by a filter 816 to remove the unwanted harmonics and results in desired output signal 436. Desired output signal 436 goes to a driver 818 and then to a power amplifier 820. The output of power amplifier 820 is amplified output signal 438. Amplified output signal 438 is ready for transmission and is routed to an antenna 822.

In the above implementation, looking back to FIG. 4, the frequency of FM control signal 432 is a sub-harmonic of the frequency of desired output signal 436. It will be understood by those skilled in the relevant art(s) that the selection of the frequencies will have an impact on the amplitude of the desired output signal 436, and will be a determinative factor as to whether or not driver 418 and/or power amplifier 420 will be needed. Similarly, those skilled in the relevant art(s)will understand that the selection of microphone 402 will have an effect on analog voice signal 424, and will be a determinative factor as to whether or not audio amplifier 404 and/or audio buffer amplifier 406 will be needed. Additionally, those skilled in the relevant art(s) will understand that the specific design of UFT 412 will be a determinative factor as to whether or not bias voltage 410 is needed.

The invention described above is for an embodiment wherein the output of the microphone is described as an analog voice signal. Those skilled in the relevant art(s) will understand that the invention applies equally to a digital signal, either digital data or a voice signal that has been digitized.

Integrated Communication System

Additionally, it will be apparent to those skilled in the relevant art(s) based on the teachings contained herein that an integrated communication system will result by combining any two of the embodiments described above, or by combining all three of the embodiments described above. This integrated communication system can be employed, for example, in a transceiver used in a family radio system.

What is claimed is:

1. A method for down-converting an electromagnetic (EM) signal wherein the EM signal is comprised of a desired signal and an undesired signal, the desired signal having a frequency of $f_D$, and the undesired signal being an image signal having a frequency of $f_I$, comprising the steps of:
   (1) splitting the EM signal into a first signal and a second signal, said first signal being substantially the same as said second signal;
   (2) aliasing said first signal with a control signal to produce a first down-converted signal;
   (3) shifting the phase of said control signal resulting in a phase-shifted control signal;
   (4) aliasing said second signal with said phase-shifted control signal to produce a second down-converted signal;
   (5) shifting said first down-converted signal to create a first shifted down-converted signal; and
   (6) combining said first shifted down-converted signal and said second down-converted signal to create an image rejected down-converted signal;
   wherein step (2) comprises sub-sampling said first signal using said control signal; and
   wherein step (4) comprises sub-sampling said second signal using said phase-shifted control signal.

2. The method of claim 1, wherein said control signal has a control frequency $f_C$, wherein $f_C$ is substantially equal to $(f_D+f_I)\div(2\cdot N)$, wherein N is any integer.

3. The method of claim 1, wherein step (3) comprises:
   shifting the phase of said control signal by an amount substantially equal to $(\pi/2)\cdot(M)$, where M is any odd integer, resulting in a phase-shifted control signal.

4. The method of claim 1, wherein step (5) comprises:
   shifting said first down-converted signal by $\pi/2$ to create a first shifted down-converted signal.

5. The method of claim 1, wherein the desired signal has a frequency substantially equal to a Family Radio Service frequency.

6. The method of claim 1, wherein the desired signal is a modulated information signal.

7. The method of claim 6, wherein said modulated information signal is one of a frequency modulated information signal and a phase modulated information signal.

8. The method according to claim 1, wherein step (2) comprises:
   (a) sub-sampling said first signal using said control signal to transfer substantial first energy from said first signal;
   wherein step (4) comprises:
   (a) sub-sampling said second signal using said phase-shifted control signal to transfer substantial second energy from said second signal.

9. A system for down-converting an electromagnetic (EM) signal wherein the EM signal is comprised of a desired signal and an undesired signal, the desired signal having a frequency of $f_D$, and the undesired signal being an image signal having a frequency of $f_I$, comprising:

a first universal frequency translator (UFT) aliasing the EM signal according to a first control signal and outputting a first down-converted signal;
   a second UFT aliasing the EM signal according to a second control signal and outputting a second down-converted signal;
   a phase shifting module receiving said first down-converted signal and outputting a first shifted down-converted signal;
   a combining module receiving said first shifted down-converted signal and said second down-converted signal and outputting an image rejected down-converted signal,
   wherein said aliasing of said first and second UFTs comprises sub-sampling the EM signal using said first and second control signals, respectively.

10. The system of claim 9, wherein said first control signal has a frequency $f_{C1}$, wherein $f_{C1}$ is substantially equal to $(f_D+f_I)\div(2\cdot N)$, wherein N is any integer.

11. The system of claim 9, wherein said second control signal is out of phase with said first control signal by a phase angle that is substantially equal to $(\pi/2)\cdot(M)$.

12. The system of claim 9, wherein said first shifted down-converted signal and said first down-converted signal are out of phase by a phase angle that is substantially equal to $\pi/2$.

13. The system of claim 9, wherein the desired signal is at a frequency that is substantially equal to a Family Radio Service frequency.

14. The system of claim 9, wherein the desired signal is a modulated information signal.

15. The system of claim 14, wherein said modulated information signal is one of a frequency modulated information signal and a phase modulated information signal.

16. The system of claim 9, further comprising a gain balance module, said gain balance module to receive said second down-converted signal and to output a gain balanced second down-converted signal, wherein said combining module receives said first shifted down-converted signal and said gain balanced second down-converted signal and outputs an image rejected down-converted signal.

17. The system according to claim 9, wherein said aliasing of said first and second UFTs comprises sub-sampling the EM signal using said first and second control signals, respectively to transfer substantial energy from said EM signal.

18. A method for down-converting an electromagnetic (EM) signal comprising the steps of:
   (1) aliasing the EM signal with a first control signal to produce a first down-converted signal;
   (2) aliasing the EM signal with a second control signal to produce a second down-converted signal;
   (3) shifting said first down-converted signal to create a first shifted down-converted signal; and
   (4) combining said first shifted down-converted signal and said second down-converted signal to create an image rejected down-converted signal;
   wherein step (1) comprises sub-sampling said EM signal using said first control signal; and
   wherein step (4) comprises sub-sampling said EM signal using said second control signal.

19. The method of claim 18, wherein said first control signal has a first control phase and said second control signal has a second control phase, further comprising the step of:

shifting said first control signal to result in said second control signal wherein the second control phase is shifted by an amount substantially equal to $(\pi/2)\cdot(M)$, where M is any odd integer.

20. The method of claim 18, wherein step (3) comprises:

shifting said first down-converted signal by $\pi/2$ to create said first shifted down-converted signal.

21. The method of claim 18, wherein the EM signal is comprised of a desired signal and an undesired signal, the desired signal having a frequency of $f_D$, and the undesired signal being an image signal having a frequency of $f_I$, wherein said first control signal has a control frequency $f_C$, wherein $f_C$ is substantially equal to $(f_D+f_I)\div(2\cdot N)$, wherein N is any integer.

22. The method according to claim 18, wherein step (1) comprises sub-sampling said EM signal using said first control signal to transfer substantial first energy from said EM signal; and wherein step (4) comprises sub-sampling said EM signal using said second control signal to transfer substantial second energy from said EM signal.

* * * * *